(12) United States Patent
Vystavěl et al.

(10) Patent No.: US 10,784,076 B2
(45) Date of Patent: Sep. 22, 2020

(54) 3D DEFECT CHARACTERIZATION OF CRYSTALLINE SAMPLES IN A SCANNING TYPE ELECTRON MICROSCOPE

(71) Applicant: FEI Company, Hillsboro, OR (US)

(72) Inventors: Tomáš Vystavěl, Brno (CZ); Bohuslav Sed'a, Blansko (CZ); Anna Prokhodtseva, Eindhoven (NL)

(73) Assignee: FEI Company, Hillsboro, OR (US)

( * ) Notice: Subject to any disclaimer, the term of this patent is extended or adjusted under 35 U.S.C. 154(b) by 88 days.

(21) Appl. No.: 16/119,017

(22) Filed: Aug. 31, 2018

(65) Prior Publication Data

US 2020/0013581 A1    Jan. 9, 2020

(30) Foreign Application Priority Data

Jul. 5, 2018   (EP) .................................... 18181809

(51) Int. Cl.
     *H01J 37/20*      (2006.01)
     *H01J 37/22*      (2006.01)
     *H01J 37/244*     (2006.01)
     *H01J 37/06*      (2006.01)
     *H01J 37/28*      (2006.01)

(52) U.S. Cl.
CPC ............ *H01J 37/222* (2013.01); *H01J 37/06* (2013.01); *H01J 37/20* (2013.01); *H01J 37/226* (2013.01); *H01J 37/244* (2013.01); *H01J 37/28* (2013.01); *H01J 2237/20207* (2013.01); *H01J 2237/20214* (2013.01); *H01J 2237/24475* (2013.01); *H01J 2237/24592* (2013.01); *H01J 2237/2814* (2013.01)

(58) Field of Classification Search
CPC .......... H01J 37/222; H01J 37/28; H01J 37/06; H01J 37/244; H01J 37/226; H01J 37/20; H01J 2237/2814; H01J 2237/20207; H01J 2237/20214; H01J 2237/24475; H01J 2237/24592
USPC ................................ 250/306, 307, 310, 311
See application file for complete search history.

(56) References Cited

U.S. PATENT DOCUMENTS

| | | | | |
|---|---|---|---|---|
| 2011/0284744 | A1* | 11/2011 | Zewail | H01J 37/228 250/307 |
| 2016/0054240 | A1* | 2/2016 | Uncovsk | G01N 23/203 250/307 |
| 2016/0181059 | A1* | 6/2016 | Vystavel | H01J 37/16 250/307 |
| 2018/0211376 | A1* | 7/2018 | Bedell | G06K 9/00134 |

* cited by examiner

*Primary Examiner* — Michael Maskell

(57) ABSTRACT

The invention relates to a method 3D defect characterization of crystalline samples in a scanning type electron microscope. The method comprises Irradiating a sample provided on a stage, selecting one set of crystal lattice planes of the sample and orienting said set to a first Bragg condition with respect to a primary electron beam impinging on said sample, and obtaining Electron Channeling Contrast Image for an area of interest on the sample. The method is characterized by performing, at least once, the steps of orienting said selected set of crystal lattice planes to a further Bragg condition by at least tilting the sample stage with the sample by a user-selected angle about a first tilt axis, and obtaining by Electron Channeling Contrast Image for a further area of interest.

19 Claims, 14 Drawing Sheets

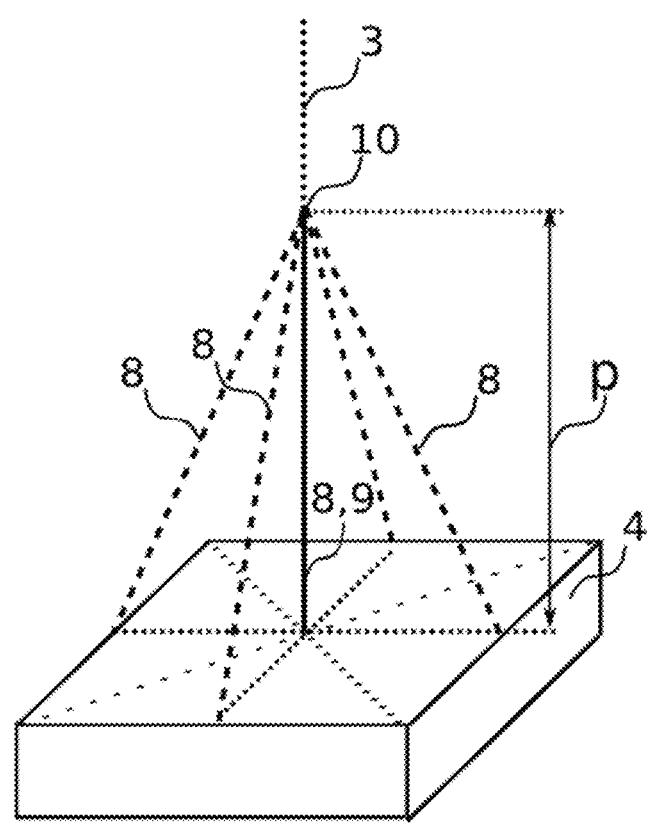
FIG: 8a

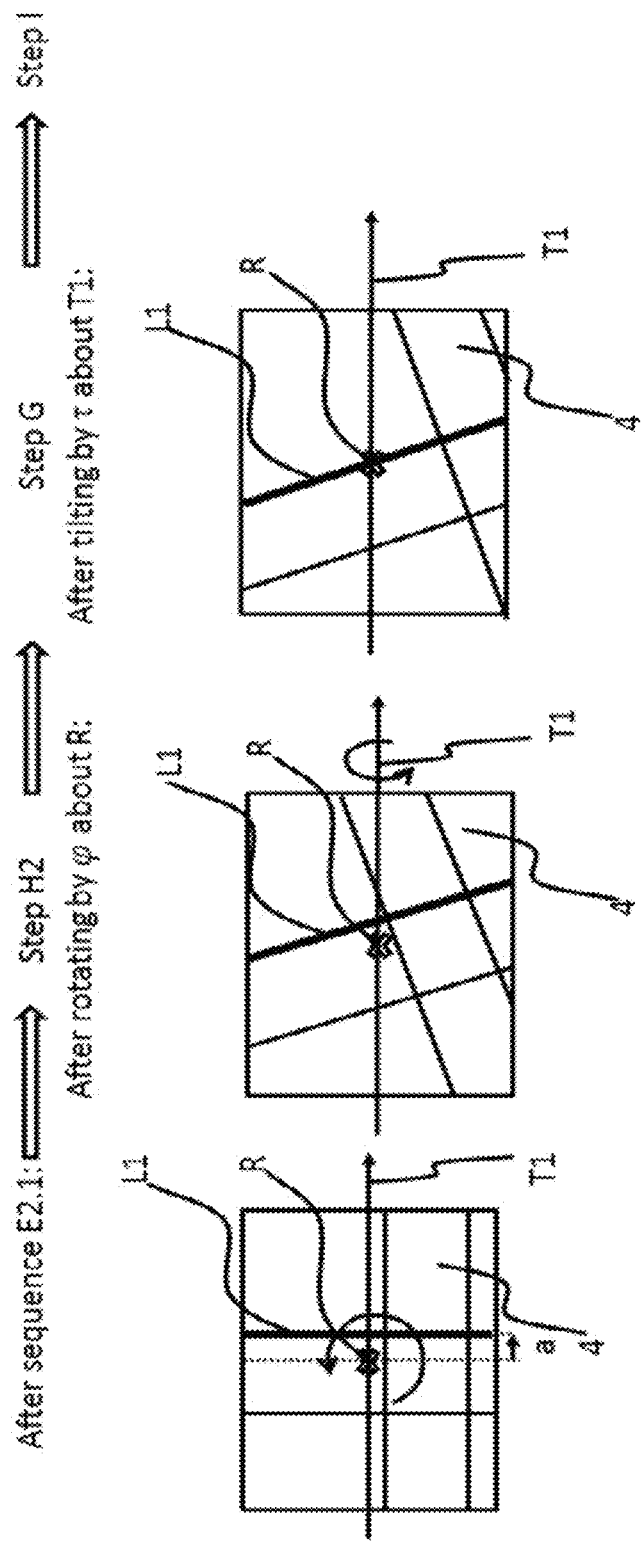

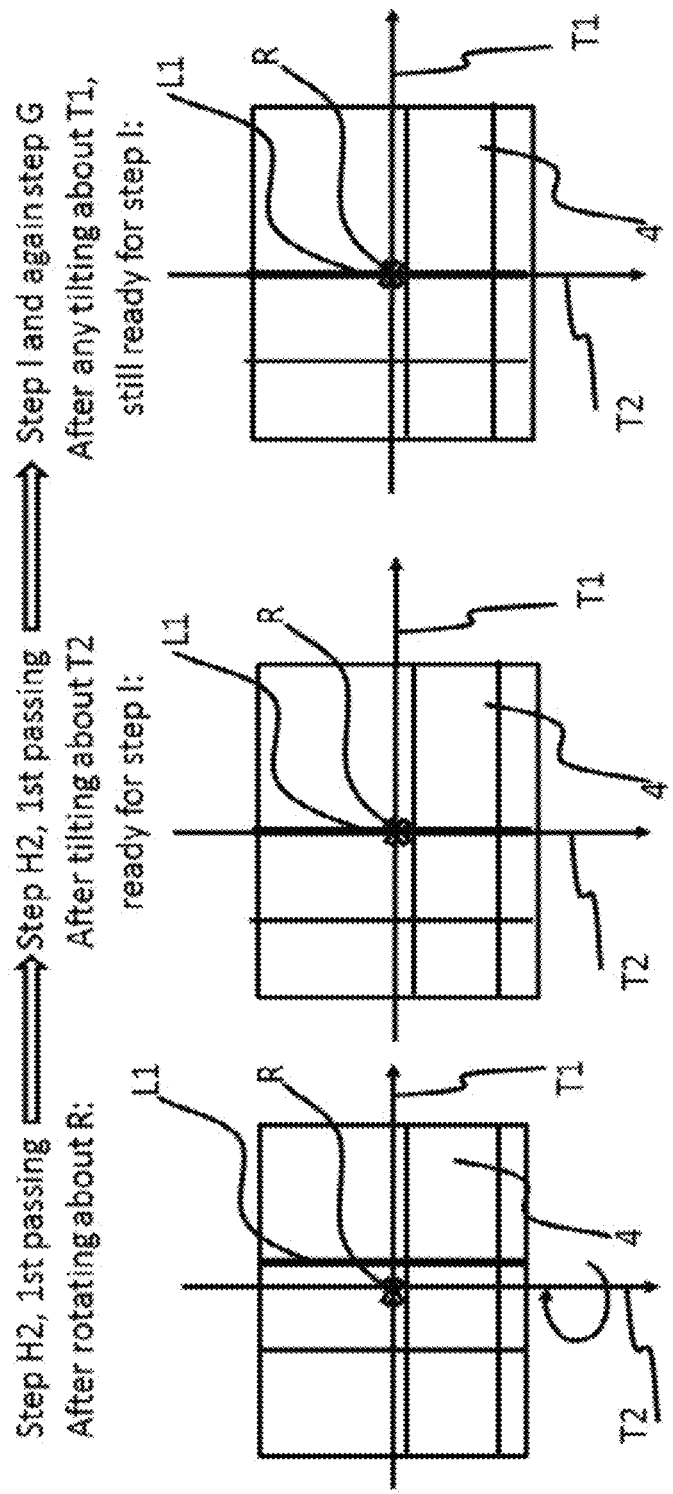

3D DEFECT CHARACTERIZATION OF CRYSTALLINE SAMPLES IN A SCANNING TYPE ELECTRON MICROSCOPE

TECHNICAL FIELD

The present invention relates generally to methods of 3D defect characterization and analysis of crystalline samples in a scanning type electron microscope using electron channeling contrast imaging.

BACKGROUND

Defects in crystalline lattice of crystalline materials have a profound impact on various material properties. They are often studied in material science, are extremely important in semiconductor industry, metal industry and many others fields of engineering.

The characterization of said defects can be performed by transmission electron microscopy (TEM) techniques. However, TEM sample preparation presents several drawbacks. First of all, the sample preparation is a destructive, complex and time demanding procedure. Extremely thin electron-transparent lamellae have to be extracted from the sample. Moreover, some sample preparation techniques may even modify the microstructure of the sample, and consequently alter the defect to be studied. Defects themselves could be affected in a thin foil, e.g. escape to the free surfaces. Another important disadvantage of this technique is the reduced observation area of several μm only, which might not be sufficient to acquire statistically relevant data, and the fact that it does not enable 3D imaging of the defects at larger scale due to the small thickness of the lamellae, which is typically about 40-80 nm only.

Another routine method for defects imaging in crystalline materials is so called Electron Channeling Contrast (ECC) Imaging. It is based on the effects of electron channeling and diffraction that are produced when an electron beam passes through the crystalline lattice of the sample. Depending on the direction of the primary electron beam with respect to the lattice, the density of backscattered electrons (BSE) emerging from the sample changes. The crystalline lattice defects can thus be monitored by capturing the BSE image as the impinging electron beam is scanned over the sample. The density of the BSE is at its minimum for the given primary beam direction, when one set of the lattice planes is close to the Bragg condition. In this case, most of the electrons channel through the lattice.

To get the best contrast, the ECC image should be recorded close to Bragg condition for a selected set of lattice planes. This can be achieved by orienting the set of lattice planes to Bragg condition using one of the methods well-known to those skilled in the art, the methods including Electron Channeling Pattern (ECP) or Electron Backscattered Patterns (EBSP) acquisition.

If a defect is present in the selected set of lattice planes, it will produce strong backscattering. When the primary electron beam scans across the sample surface and the BSE are detected by a BSE detector, which is typically placed above the sample, the defects are visible in the BSE detector image as a bright lines or spots on a dark background. Bright spots are visible when the defect intersects the sample surface. Again, the impossibility of non-destructive 3D defect imaging is among the main drawbacks of this technique.

To get a 3D defect imaging using ECCI according to the state-of-the-art methods, it is necessary to combine it with FIB (focused ion beam) tomography. However, this method is destructive: fine slices are sequentially "cut off" from the sample by the FIB and an ECCI image is recorded after each slicing. The series of ECCI images corresponding to different layers of the material is then used for 3D reconstruction and analysis of the sample.

For more details about the ECC imaging (ECCI), see for example:

Angus J. Wlkinson, Peter B. Hirsch: Electron diffraction based techniques in scanning electron microscopy of bulk materials, Micron, Volume 28, Issue 4, August 1997, pages 279-308

J.-I. Zhang et al.: A study on the geometry of dislocation patterns in the surrounding of nanoindents in a TWIP steel using electron channeling contrast imaging and discrete dislocation dynamics simulations, Materials Science & Engineering A 636 (2015), pages 231-242

More information on 3D defects visualization destructive methods using the sample slicing can, for example, be gleaned from the following documents:

S. Yamasaki et al., 3D visualization of dislocation arrangement using scanning electron microscope serial sectioning method, Scripta Materialia 101 (2015) 80-83, EP2506285 to Doenitz et al. for "Particle beam device having a detector arrangement"

SUMMARY OF THE INVENTION

In view of the above, it is an object of the invention to provide an improved method of 3D defect characterization and analysis of crystalline samples in a scanning type electron microscope (SEM). In particular, it is an object of the invention to provide a method that is at least less destructive compared to the prior art methods such as FIB slicing or TEM lamella preparation.

To this end, the invention provides a method according to claim 1. The method according to the invention is in particular performed in a scanning type electron microscope. The scanning type electron microscope comprises:

A sample stage for holding a sample;

An electron source for producing a primary electron beam, as well as an illuminator having an electron-optical axis, wherein said electron microscope is arranged for directing said primary electron beam through the illuminator so as to irradiate said sample for producing an interaction that causes particle radiation to emerge from the sample, said radiation including backscattered electrons (BSEs); and At least one detector for detecting said BSEs.

According to the invention, the method comprises the steps of:

Irradiating a sample provided on said stage;

Selecting one set of crystal lattice planes of the sample and orienting said set to a first Bragg condition with respect to the primary electron beam impinging on said sample;

Obtaining by means of said at least one detector Electron Channeling Contrast Image for an area of interest on the sample.

The sample is mounted on a stage, typically provided with several means for stage movements which in a case of a standard SEM include tilt about at least one tilt axis and rotation about at least one rotation axis. One of the tilt axes is referred to as a first tilt axis. Double tilt stages with two tilt axes are also available. Stages with even more rotational and/or tilt drives and axes can also be used to perform the method according to the invention. Stage movements also include translational movements along at least two non-parallel axes.

According to the method of the invention, the following steps are then performed at least once:

a) Orienting said selected set of crystal lattice planes to a further Bragg condition, by at least tilting the sample stage with the sample by a user-selected angle about a first tilt axis;

b) Obtaining by means of said at least one detector Electron Channeling Contrast Image for a further area of interest on the sample, wherein said further area of interest at least partly overlaps a previously selected area of interest.

This means that said initially selected set of crystal lattice planes is oriented to a further Bragg condition, different from the first Bragg condition, by at least tilting the sample stage with the sample by a user-selected angle about a first tilt axis. This means that the sample is observed at least twice, at different tilt angles. In case the tilting about the first tilt axis is not sufficient for establishing a further Bragg condition, then one or more sample stage movements may be used to establish said further Bragg condition different from the first Bragg condition. In this further Bragg condition, Electron Channeling Contrast Image for a further area of interest on the sample is obtained by means of said at least one detector. It should be noted that said further area of interest at least partly overlaps a previously selected area of interest.

Furthermore, it is conceivable that steps a) and b) are repeated multiple times, establishing even further Bragg conditions (that are mutually different to each other) and obtaining Electron Channeling Contrast Image for a plurality of areas of interest, wherein subsequent areas of interest at least overlap at least a previously selected area of interest.

Thus, according to the present invention, ECC images are acquired for different tilt angles of the sample with respect to the axis of the impinging primary electron beam, while establishing Bragg conditions for the selected set of crystal lattice planes at these different angles. The series of these ECC images recorded at different tilt angles may serve as a basis for 3D reconstruction of the crystal structure of the sample and its defects across the volume. The method according to the invention thus provides a non-destructive way of 3D defect characterization. In addition, the method is faster than the prior art 3D defects visualization techniques and allows for visualization of large areas of interest. Bulk samples can be observed by this new method and no complex sample preparation procedure is needed. The method is well-suited for scanning-type electron microscopes.

The method may comprises a combination of ECCI technique with sample tilting under controlled diffraction conditions derived from Electron Channeling Patterns (ECP) or Electron Backscattered Patterns (EBSP), i.e. while maintaining Bragg condition for a selected set of lattice planes. To achieve improved contrast of ECC imaging, the method may make use, in an embodiment, of ECP or EBSP recording. These techniques are well-known to those skilled in the art. The ECP or the EBSP is acquired by a BSE detector and comprises several sets of quasi-parallel dark lines called Kikuchi lines.

This sequence of steps a) and b) in which Bragg condition is established for still the same set of crystal lattice planes ensures that the visualization of defects is optimized, since tilting is performed along said first tilt axis, which in an advantageous embodiment is substantially perpendicular to said selected set of crystal lattice planes. This will be explained more in detail in the following parts of the disclosure.

In an embodiment, the series of ECC images obtained for different tilt angles is used for 3D reconstruction of crystal lattice defects, which can be obtained in a fast and non-destructive way. As an alternative, two ECC images obtained for two different tilt angles may be used in an embodiment for stereoscopic defect viewing.

Embodiments for particular tilt and/or rotation axes configuration are also disclosed, together with calculation methods for determining rotation angles for user selected tilt angles.

Embodiments for translational movement and/or tilting movement and/or rotational movement of the stage may include one or more of the following, or any combination thereof:

A tilting device for tilt movement of the stage about the first tilt axis;

A translation device for translational movement of the stage in a plane whose normal encloses an angle in the range from +10° to −10° with the electron-optical axis (3);

A rotation device for rotational movement of the stage about at least one rotation axis, wherein this at least one rotation axis is at least non-parallel to the first tilt axis (T1), and in case of a further rotation axis also non-parallel to this further rotation axis;

An additional tilt device for tilt movement of the stage about at least one additional tilt axis that is non-parallel to the first tilt axis, and in case of at least one rotation axis also non-parallel to this rotation axis.

It is noted that the tilting device, any translation device, any rotation device and/or any additional tilt device may be embodied in a single stage manipulator apparatus comprising one or more of the aforementioned devices. Thus, in an embodiment the electron microscope comprises a stage manipulator apparatus having at least one device selected from the group consisting of: a tilting device, a translation device, a rotation device, and an additional tilt device.

The foregoing has outlined rather briefly the features and technical advantages of the present invention in order that the following detailed description of the invention may be better understood. Additional features and advantages of the invention will be described hereinafter. It should be appreciated by those skilled in the art that the conception and specific embodiments disclosed may be readily utilized as a basis for modifying or designing other structures or procedures for carrying out the same purposes of the present invention. For example, the goal of establishing the Bragg condition for the same set of crystal lattice planes during the acquisition of the ECC image-tilt series can be achieved also by other combinations of stage rotational and/or tilt movements than those that are specifically disclosed hereinafter, as it can be realized by those skilled in the art. It should also be realized that such equivalent procedures do not depart from scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIG. 8a shows a central axis of scanning in a normal scanning mode.

FIG. 12 a, b, c shows the procedure of making the line L1 to pass through the center of the observed image in an embodiment with one rotation axis R and one tilt axis T1.

FIG. 13 a, b, c shows the procedure of making the line L1 to pass through the center of the observed image in an embodiment with one rotation axis R and two tilt axes T1, T2.

Figure 1A:
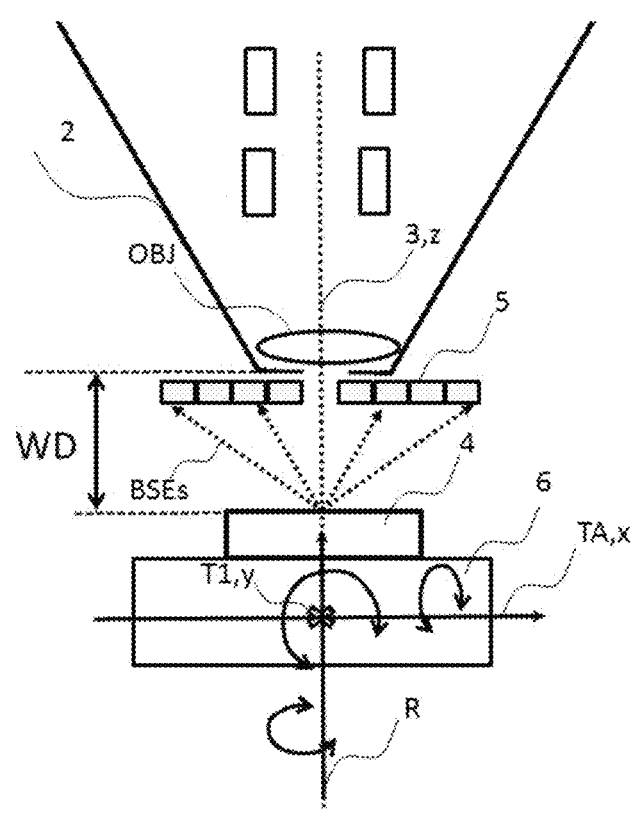
FIGS. 1a, 1b show an experimental setup according to an embodiment of the invention with the bottom part of the illuminator, the BSE detector and the sample stage tilted to 2 different angles. An exemplary configuration of tilt and rotation stage axes is also depicted, together with an example of axes of translational stage movements.

The figures are schematic and for sake of clarity, they are not drawn to scale.

DETAILED DESCRIPTION OF EMBODIMENTS

Embodiments of the present invention provide a method for 3D defect characterization of crystalline samples in a scanning type electron microscope. It should be noted that a scanning type electron microscope may include a scanning electron microscope (SEM) as well as a scanning transmission electron microscope (STEM). For sake of simplicity, all these scanning type electron microscopes will be referred to hereunder as SEMs. It should be also noted that in an embodiment a field emission gun scanning type electron microscope is used for carrying out the method according to the invention. It goes without saying that combined multibeam devices can be used as well, as for example a dual-beam device combining an electron beam with a focused ion beam, or triple beam devices combining the latter with for example a laser beam.

The method according to the invention, and as defined in claim 1, generally comprises irradiating a sample, orienting a selected set (S1) of crystal lattice planes to a first Bragg condition, and obtaining Electron Channeling Contrast Image for an area of interest on the sample. Then the following steps a) and b) are performed at least once:

a) Orienting said selected set (S1) of crystal lattice planes to a further Bragg condition, by at least tilting the sample stage (6) with the sample (4) by a user-selected angle about a first tilt axis (T1); and b) Obtaining by means of said at least one detector (5) Electron Channeling Contrast Image for a further area of interest on the sample (4), wherein said further area of interest at least partly overlaps a previously selected area of interest.

A more detailed embodiment of the invention will now be explained under reference to steps A to I. It is noted that, although a strict separation between steps denoted with capital letters A-I and steps with lower-case letters a) and b) is intended, the detailed steps G to I generally correspond to steps a) and b) described above. Thus, an embodiment of the invention is described below and has the following sequence of steps from A to I:

Step A:

Providing a sample stage 6 for holding a sample 4, and mounting said sample on the stage 6.

The sample stage 6 is moveable and is placed in a vacuum chamber of the SEM, which can be pumped by various types of vacuum pumps. To get the best results, the sample surface facing the impinging primary electron beam is flat and polished.

Step B:

Providing an electron source producing a primary electron beam 1, providing an illuminator 2 having an electron-optical axis 3, and directing the primary electron beam 1 through the illuminator 2 so as to irradiate the sample 4, thereby producing an interaction that causes particle radiation to emerge from the sample 4.

The illuminator 2 serves to manipulate a "raw" electron beam from the source and perform upon it certain operations such as focusing, aberration mitigation, scanning, beam axis tilting, etc. These manipulations are well known to those skilled in the art. The illuminator 2 will generally comprise one or more electron lenses, and may comprise other types of electron-optical components. The illuminator usually includes a deflector to cause its output beam to perform a scanning motion across the specimen being investigated. Other electron-optical components may be placed also under the illuminator, for example for the post-final-lens deflection purposes.

After having left the illuminator, the primary electron beam 1 impinges on the sample 4. As a result of the interaction of the primary electron beam 1 and the material of the sample 4, particle radiation emanates from the sample 4. This particle radiation includes among others backscattered electrons (BSEs).

Step C:

Providing at least one detector 5 to detect the BSEs resulting from the interaction of the primary electron beam with the sample.

Figure 1B:
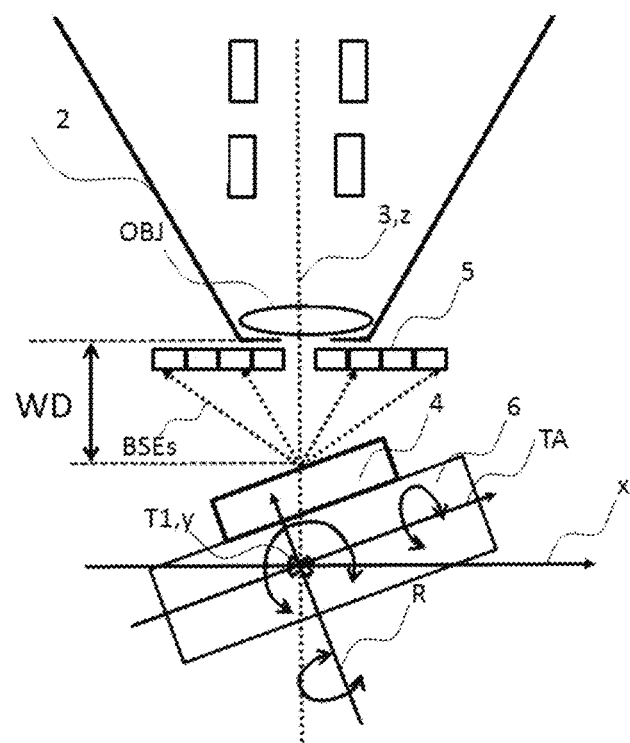

The detector 5 is any detector suitable for BSE detection, such as scintillation-photomultiplier detector, semiconductor detector or any other. It is usually placed under the final bottom part of the illuminator 2, i.e. under the objective lens of the SEM, as it is illustrated in FIGS. 1a, 1b. Said detector 5 may be retractable and concentric or in other words annular with an opening in the center that allows the primary electron beam to pass. However, any type of BSE detector placed above the sample can be used for this purpose, including different types of post-lens detectors and in-lens detectors. A combination of detectors 5 can also be used. The detector 5 or the detectors 5 is/are connected to a processor and to a screen. The output of the detector 5 is processed by a processor, can be stored in a memory and imaged on a screen. The images obtained from the detector or detectors in a way that will be described more in detail hereinafter are used by the user for further manipulation with the sample and for adjusting the imaging conditions, including maintaining Bragg condition. The image data so obtained are memorized and/or analyzed by the processor.

Step D:

Providing first tilt axis T1 and providing means for tilt movement of the stage 6 about at the first tilt axis T1. This first tilt axis T1 will be used for acquiring tilt-ECC images series.

Step E:

Selecting one set S1 of crystal lattice planes of the sample 1 and orienting this set S1 to Bragg condition with respect to the primary electron beam 1 impinging on the sample 4.

In embodiments, for orienting the set S1 of crystal lattice planes to Bragg condition, use is made of Electron Channeling Pattern (ECP) or of Electron Back-Scattered Pattern (EBSP) acquired from the sample 4 by one of the detectors 5.

Only a very brief overview of the ECP obtaining technique will be given hereinafter, keeping in mind that it is well-known to the skilled artisans and that the corresponding theoretical background can be found e.g. in "Scanning Electron Microscopy", L. Reimer, Springer Verlag (1985), ISBN 3-540-13530-8, more specifically in chapter 9. In chapter 9.1, the reader can find details about Bragg condition. Chapter 9.2 teaches about ECP.

Crystals are anisotropic. Depending on the direction of the primary electron beam with respect to the lattice, the density of backscattered electrons (BSEs) emerging from the sample shows anisotropy in its turn. When the direction of the impinging primary electron beam with respect to the crystalline lattice changes, i.e. when the beam is "rocked", which means that its angle of incidence on the sample is varied, this anisotropy leads to creation of the ECP, containing a set of bands and lines called Kikuchi bands and lines, that can be detected for example by a BSE detector placed above the sample.

Figure 2:
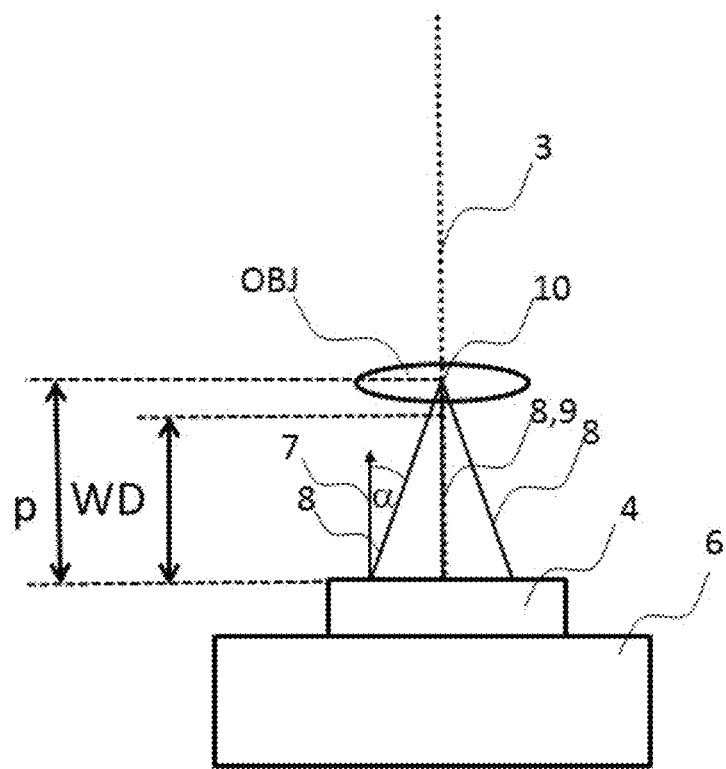
FIG. 2 is an example of beam rocking.

It is noted that in the context of this invention, obtaining ECP typically includes the following steps: By means of electron-optical elements inside or inside and outside the illuminator 2, causing the primary electron beam 1 to irradiate the sample 4 while varying angle α of incidence between the axis 8 of the impinging primary electron beam 1 and a normal to the sample surface 7, which is called beam rocking. An example of beam rocking is shown in FIG. 2. As an alternative, a stage rocking can be used, the stage rocking producing the same effect as the beam rocking, i.e. it leads to varying the angle α of incidence between the axis 8 of the impinging primary electron beam 1 and a normal to the sample surface 7. An output of the detector 5 is recorded as a function of said angle (a) of incidence, the so-obtained observed image being the ECP. An example of the acquired ECP is shown in FIG. 3.

It should be appreciated by those skilled in the art that there are several methods how to perform the beam rocking, as for example the standard method, in which a large sample is scanned at low magnification (field of view of several mm of diameter). Thanks to this large field of view, the angle of incidence varies sufficiently across the scanned area. In this method, the standard SEM scanning coils are excited as in the conventional imaging mode. Other methods to perform the beam rocking are also available and may include e.g. post-lens deflection method, double-deflection method, deflection-focusing method etc. Stage rocking can also be used. For more details, see L. Reimer: "Scanning Electron Microscopy" (previously cited). All of these methods fall within the scope of this invention and can be employed to obtain the ECP in Step E.

As an alternative to the ECP, Electron Back-Scattered Patterns (EBSP) can be used in step E as a method to determinate the diffraction condition, in other terms to orient a set of lattice planes to Bragg condition. This method is reciprocal to the ECP technique and is well-known to the skilled artisans. It is described in, for example, "Scanning Electron Microscopy", L. Reimer, Springer Verlag (1985), ISBN 3-540-13530-8, more specifically chapter 8.3: "Electron Diffraction Effects Associated with Scattered Electrons", most specifically chapter 8.3.2: "Electron Backscattered Patterns (EBSP)" A specific method of EBSP acquisition which is also suitable to perform the method according to the present invention is disclosed in EP2991098 to the applicant of the present invention. EBSP is a method of crystalline lattice sets orientation for polycrystalline samples, where the studied areas are smaller than in monocrystalline samples.

Figure 3:
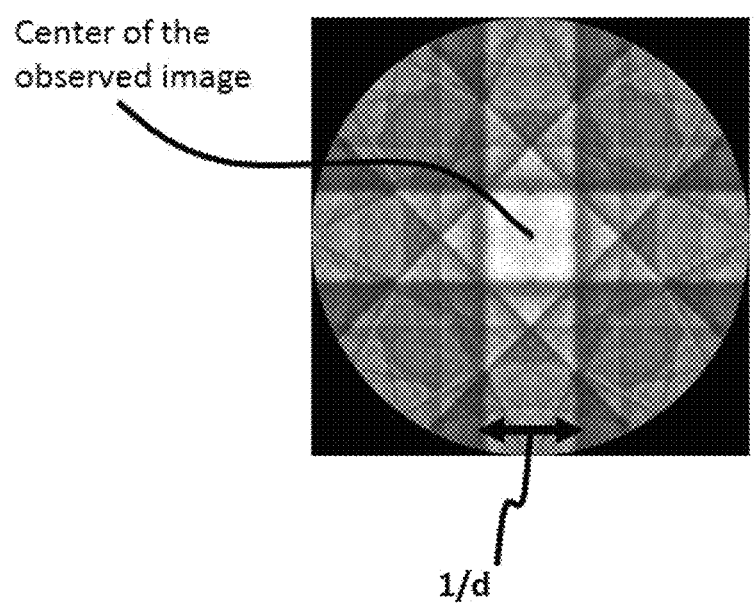
FIG. 3 is an example of an ECP.

It can be seen that the pattern in FIG. 3 includes several sets of quasi-parallel lines called Kikuchi lines. Some of the lines are bright, some are dark. The spacing between a pair of neighboring parallel dark Kikuchi lines, i.e. the width of a Kikuchi band, is proportional to 1/d, d being the spacing between the crystal lattice planes of a set of planes that corresponds to the said pair of dark Kikuchi lines.

An EBSP would exhibit a similar set of dark Kikuchi lines.

The density of the BSE is at its minimum when the primary beam direction and one set of the lattice planes is close to Bragg condition. In this case, most of the electrons travel deep into the crystalline sample. This is called electron channeling. It appears as a dark Kikuchi line in the ECP or in the EBSP.

The Bragg's law for a constructive interference of a planar electron wave diffracted on crystalline lattice is expressed by:

$$2d_{hkl}\sin(\theta)=n\lambda,$$

where $d_{hkl}$ is the spacing between the lattice planes with Miller indices hkl, θ is the angle of the impinging electron wavevector with the set of lattice planes with Miller indices hkl, n is a positive integer and λ is the wavelength of the incident electron wave. Miller indices form a well-known notation system in crystallography.

Figure 4:
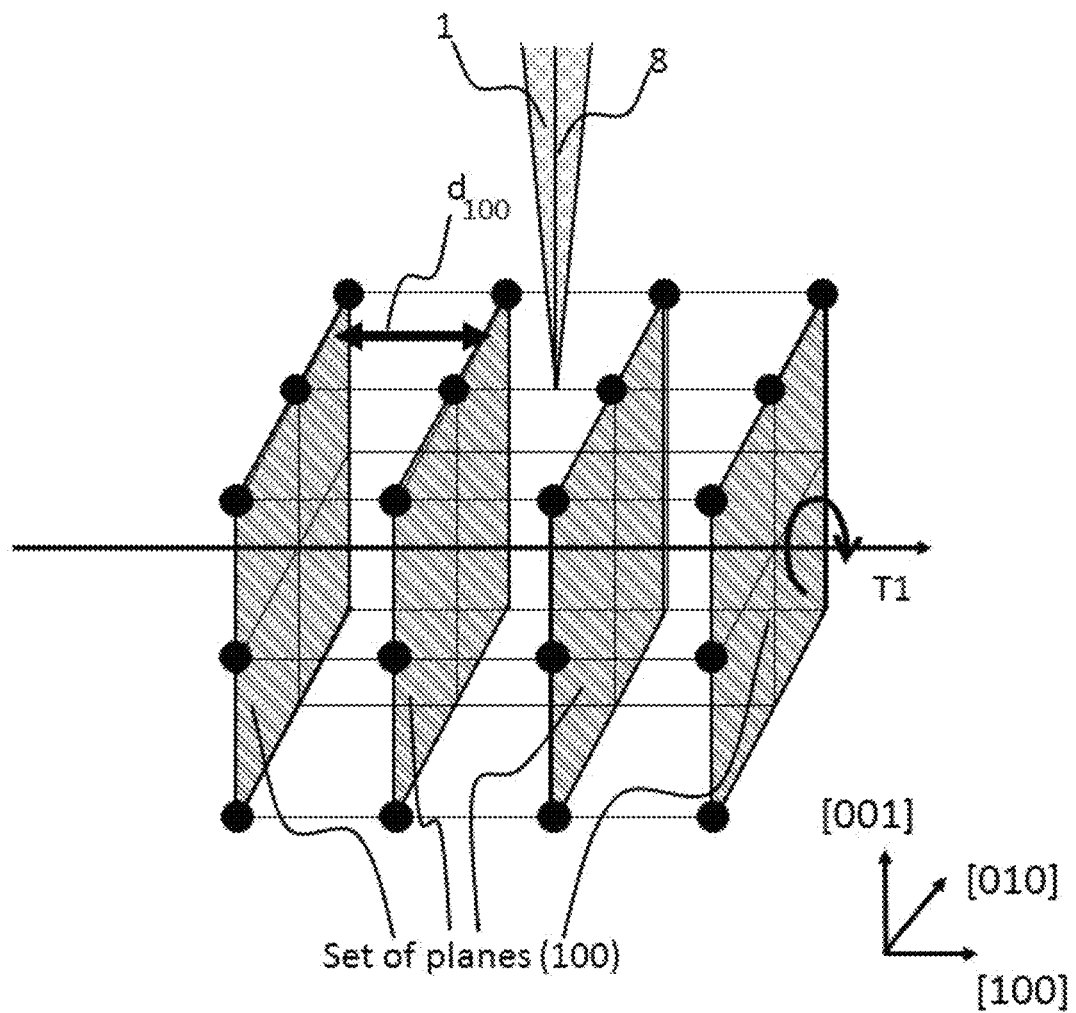
FIG. 4 is an example of the mutual orientation of the primary electron beam and one set of crystal lattice planes.

When the above-expressed condition for the given set of lattice planes hkl and for the incident electron beam is satisfied, we say that the set of lattice planes is at Bragg condition. In this case, the constructive interference in the beam diffracted from this set of planes is at its strongest, and minimum backscattering occurs. For more details, see e.g. "Scanning Electron Microscopy", L. Reimer, Springer Verlag (1985), ISBN 3-540-13530-8, more specifically chapter 9.1 or Zaefferer et al., Theory and application of electron channeling contrast imaging under controlled diffraction conditions, Acta Materialia 75 (2014), 20-50. In between two neighboring quasi parallel dark Kikuchi lines, there are so-called Kikuchi bands that can be indexed by Miller indices to attribute them the corresponding sets of crystal lattice planes. The width of a Kikuchi band is related to the Bragg angle for the given set of lattice planes, and thus to the distance between the lattice planes belonging to this set. For example, in FIG. 4, the set of crystalline lattice planes with Miller indices 100 is shown. If we note the distance between the before mentioned crystal lattice planes by $d_{100}$, the width of the corresponding Kikuchi band is proportional to $1/d_{100}$. FIG. 4 shows also an example of the mutual orientation of the primary electron beam 1 and one set of crystal lattice planes. In FIG. 4, the first tilt axis T1 is also shown. Tilting around such oriented first tilt axis T1 will not change how the impinging primary electron beam 1 is diffracted from the set of planes (100). On the other hand, defects in crystal will change their position relative to the impinging primary electron beam 1 when tilting. This allows for 3D visualization of the defects.

Figure 5:
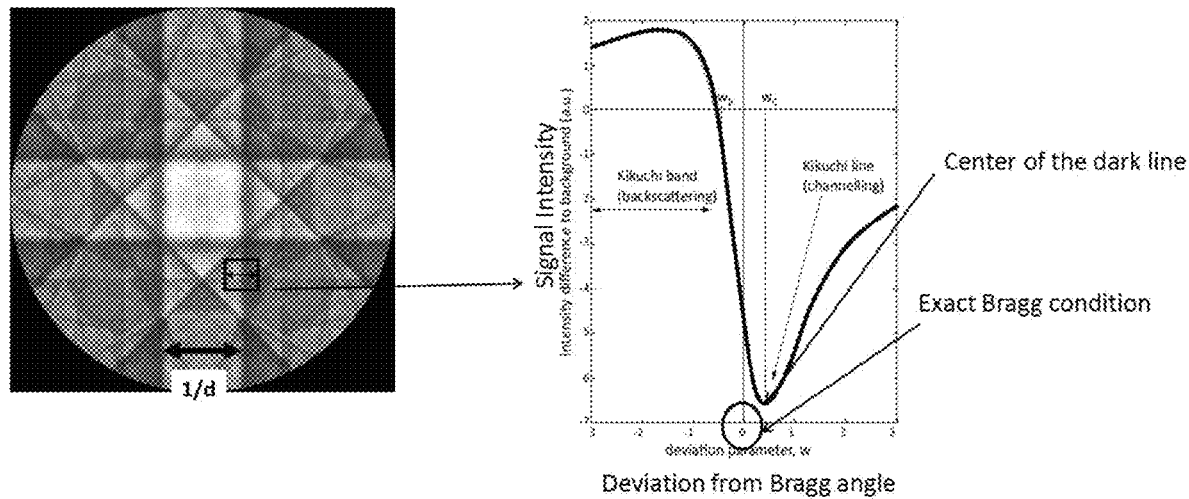
FIG. 5 is a graph of the BSE signal intensity profile in the sense perpendicular to one of the Kikuchi dark lines in an ECP.

FIG. 5 shows in the right-hand side a typical BSE signal intensity profile in the sense perpendicular to a Kikuchi line in a zone corresponding to the little square with arrows inside the ECP shown in the left-hand side of FIG. 5. It can be seen that the minimum of the intensity profile which is approximately in the center of the dark Kikuchi line, is close to the Bragg condition. It corresponds to the situation when most electrons channel into the depth of the crystal. When the BSE intensity gets higher, it means that the channeling quenches and the backscattering becomes predominant—this corresponds to the Kikuchi band between the two dark quasi-parallel Kikuchi lines, as it is also shown in the graph in FIG. 5 on the left from the minimum.

It will be appreciated by those skilled in the art that several other imaging parameters must be adjusted for the ECP or EBSP acquisition, the parameters including accelerating high voltage (HV), working distance (WD), beam current, aperture diameter etc. These are chosen depending on the material one is working with. This first ECP or the first EBSP, if the method of EP2991098 is used, is typically taken with a non-tilted stage, i.e. with the examined surface of the sample substantially perpendicular to the electron-optical axis 1. However, the step E can be performed also with a tilted stage.

Figure 6:
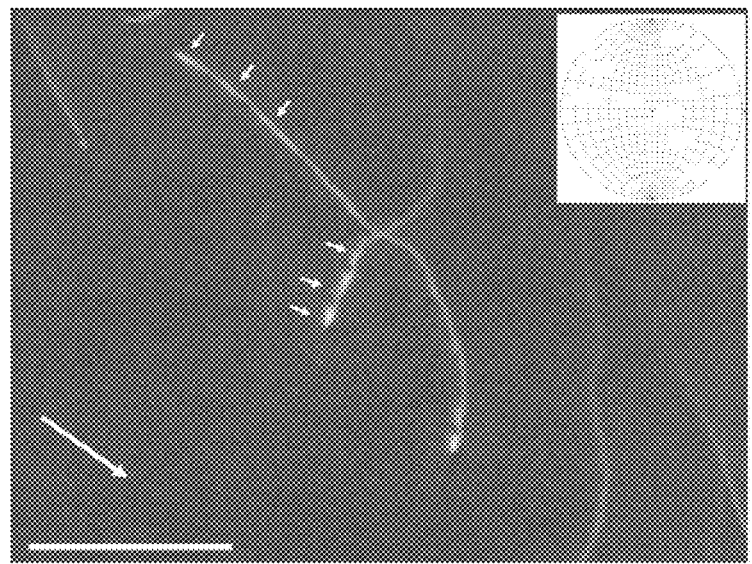
FIG. 6 shows an example of an ECC image according to S. Zaefferer, N.-N. Elhami: Theory and application of electron channeling contrast imaging under controlled diffraction conditions, Acta Materialia 75 (2014) 20-50

Step F:

Obtaining by means of one of the detectors 5 Electron Channeling Contrast Image (ECCI) for an area of interest on the sample 4. An example of an ECCI is shown in FIG. 6.

In some embodiments, an annular BSE 5 detector placed between the sample and the illuminator is used for capturing the ECC image, as it is shown in FIGS. 1a, 1b. However, an arbitrary BSE detector can be used as detector 5 in this invention.

In this disclosure, "obtaining by means of one of the detectors 5 Electron Channeling Contrast Image (ECCI) for an area of interest on the sample 4" should be understood as recording an output of one of the detectors 5 as a function of scan position within a user-selected area of interest on the sample 4. By scan position, a position of the impinging primary electron beam 1 on the sample surface is meant. During this procedure, a standard scanning of the primary electron beam 1 across the sample surface is performed. To perform the scanning, the deflectors placed in the illuminator are used, as it is well known in the art. The output of the detector 5 is processed by a processor, can be stored in a memory and is usually displayed on a screen.

If a defect is present, it will produce strong backscattering. In other words, the channeling through the set of planes S1 will be perturbed by this defect. When the primary electron beam scans in a normal scanning mode across the sample surface and the BSE are detected by a BSE detector 5, the defect will be visible in the BSE detector image as a bright feature on a dark background, as it is shown in FIG. 6. However, any image of a defect obtained by this state-of-the art ECCI technique is just a 2D projection of a 3D object. To know the $3^{rd}$ dimension, it is necessary to tilt the sample and follow the procedure including the sequence of steps G to I as it will be disclosed hereinafter.

Figure 7:
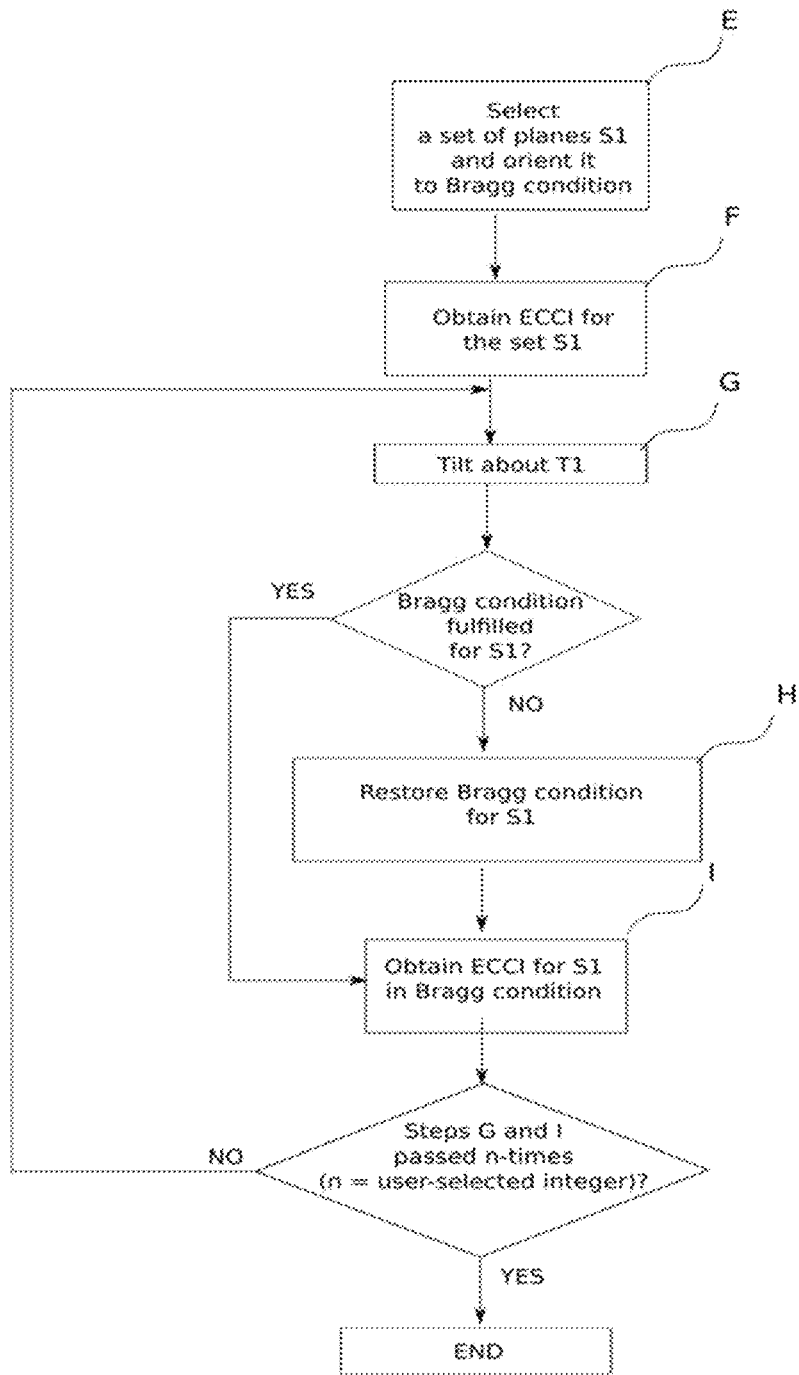
FIG. 7 is a schematic flowchart of a typical general 3D ECC imaging procedure

A schematic flowchart of this procedure is shown in FIG. 7 for one embodiment in which step G precedes step H and in which step H results directly to restoring the Bragg condition. For sake of clarity, steps from A to D are not shown in FIG. 7. The steps E and F are shown in FIG. 7 as starting points of the newly designed procedure, the new procedure including the steps from G to I and as an option, their repetition, according to this disclosure.

The idea behind this newly invented procedure is the following: Crystals are symmetric. When a crystalline sample is tilted around an axis that is perpendicular to a set of crystalline lattice planes for which the Bragg condition is fulfilled, this tilting will not change how the primary electron beam is diffracted from this set of planes and most importantly, the tilting will not change how defects appear from image to image in the tilt series, as the contrast of defects remains the same. As the defects in crystal change their position relative to the electron beam when tilting, this allows for 3D visualization of the defects.

If, on the other hand, the sample were tilted randomly without keeping the Bragg condition, the defects could well be invisible, or appearing totally different from one picture to another. For example, in one exemplary embodiment shown in FIG. 4, the set of planes (100) is in Bragg condition. Tilting around an axis perpendicular to this set of planes (100) will not change the way how the primary electron beam 1 is diffracted from the set of planes (100). One example of tilt axis perpendicular to the set of planes (100) is noted T1 in FIG. 4. This axis can be used as the first tilt axis for performing the step G according to the invention. The set of planes with Miller indices (100) is highlighted in FIG. 4. It is noted that this is only one out of many possible examples: any other set of planes selected by the user can be set to Bragg condition in a similar way. For 3D defects visualization, the same principle, i.e. tilting around an axis perpendicular to a set of planes brought to Bragg condition, is valid also for other sets of planes than the one shown in FIG. 4, and is valid also for other crystal classes than the cubic class shown in FIG. 4 as an example.

When a series of tilts is performed about the first axis T1 while finely controlling the channeling conditions, i.e. while maintaining the Bragg condition, for the selected set of crystalline lattice planes, a corresponding series of ECC images can be obtained, each image corresponding to one particular tilt angle. This series can be used for 3D reconstruction of the visible crystalline lattice defects. It should be stressed that maintaining Bragg condition is necessary for achieving comprehensive analysis.

To this end, the sequence of steps from G to I is performed, as it is shown in FIG. 7 and described in detail hereinafter:

Step G:

Tilting the sample stage 6 with the sample 4 mounted on it by selected angle about the first tilt axis T1.

The sample is tilted about the first tilt axis T1. This axis is selected to perform a series of tilts that will serve for a reconstruction of crystalline lattice defects in 3D. The tilt angle about this axis will be recorded together with the corresponding ECC image obtained for this tilt, as it will be explained more in detail hereinafter.

It is noted that tilting the sample stage 6 leads to tilting the sample 4 mounted on the sample stage. When the sample 4 is mounted on the sample stage 6 in a non-tilted position, the sample surface to be studied is typically perpendicular to the electron-optical axis 3. For crystallographic studies, the surface of the sample 4 to be examined is flat and polished. Sample stage 6 tilts are thus interconnected to the tilts of the examined surface of the sample 4. Similarly, sample stage 6 rotations are interconnected to the rotations of the examined surface of the sample 4.

Step H:

If Bragg condition is not fulfilled for the previously selected set S1 of crystal lattice planes, making a sample stage 6 movement or movements leading to restoring the Bragg condition for this set S1 of crystal planes. The sample stage (6) is provided with means to realize said movement or movements. The movements leading to restoring Bragg condition can result either directly to restoring Bragg condition, either to a preliminary stage, from which Bragg condition can be obtained by performing the step G, i.e. by tilting about the first tilt axis T1. The stage movements performed as a part of the step H do not consist of a simple reverse tilting by −τ, given that such a movement would not meet the aim of this invention, which is the acquisition of series of ECCIs for different tilt angles. The methods leading to restoring the Bragg condition in step H are similar to the methods used in step E for setting the Bragg condition and will be described in detail hereinafter.

Step H usually follows step G as it is shown in FIG. 7, but in some specific embodiments, the order of these steps can be inversed if the tilt angle of step G is selected synergistically with the sample stage movements of step H, see one possible version of Embodiment 1 below and FIGS. 12*b*, 12*c*.

Step I:

Obtaining by means of one of the detectors 5 Electron Channeling Contrast Image for an area of interest on the sample 4. This area of interest at least partly overlaps the area of interest selected in the preceding Electron Channeling Contrast Image obtaining step.

The steps from G to I can be repeated. The number n of repetitions of the sequence of steps from G to I is set by the user according to the desired number of tilt-ECCI recordings, n being a user-selected integer.

The first ECC image is acquired in step F. The second ECC image for a different tilt angle about the first axis T1 than in step F is acquired during the first passing through the sequence of steps G to I. In one aspect of this method, these two ECCIs acquired for two different sample stage tilt angles about the first tilt axis T1 are used for stereoscopic observation.

In another aspect of this method, the number n of repetitions of the sequence of steps from G to I can be higher than one and multiple ECC images acquired for different sample stage tilt angles about the first tilt axis T1 are accumulated. In all the steps from E to I and during all the repetitions of the steps G to I, it is advantageous to maintain constant several imaging parameters including working distance (WD), accelerating voltage (HV), aperture diameter, beam current and horizontal field width when acquiring the ECC images.

To orient the selected set S1 of crystal lattice planes to Bragg condition in steps E and/or H, it is advantageous to make use an EBP or an EBSP acquired by one of the detectors 5.

In embodiments, the method may further comprise one or more of the following steps J to L:

Step J:

Providing means for translational movement of the stage 6 in a plane whose normal encloses an angle in the range from +10° to −10° with the electron-optical axis (3).

According to an embodiment, the translational movement of the stage 6 takes place in a plane whose normal is parallel to or substantially parallel to the electron optical axis 3. Generally, the movement in the before mentioned plane is realized by moving the stage along two translational axes, while the movements can be performed along each of these axes separately or along both of them together to produce a combined movement. There is no need for the two translational axes to be perpendicular. Having said that, it should be noted that the standard SEM stages are provided with perpendicular translational axes. This typical stage is shown in FIGS. 1*a*, 1*b* illustrating one embodiment of the invention. The translational axes that ensure the translational movement of the stage 6 in the plane whose normal is substantially perpendicular to the electron optical axis 3 are noted x, y in FIGS. 1*a*, 1*b*.

In typical SEM stages, a movement along a third translational axis is usually present, the third translational axis may be perpendicular to the preceding two translational axis x, y, although this is not necessary. In FIGS. 1*a*, 1*b*, the third translational axis, which is however not necessary to carry out the invention, is noted by z, i.e. with z perpendicular to both x and y. The stage can then perform a combined translational movement in 3D space.

Step K:

Providing at least one rotation axis R, each of these rotation axes R being non-parallel to all the others rotation axes R and to the first tilt axis T1, and providing means for rotational movement of the stage 6 about at least one rotation axis R. The number of rotation axes is not limited.

Various combinations of stage movements are usually possible in SEMs. The most common are so-called 5 axes stages with 3 perpendicular transitional movements along the axes x, y, z, one rotational movement about one rotation axis R and one tilt movement about the first tilt axis T1. The typical mutual position of these axes is shown in FIGS. 1*a*, 1*b*. Note that in these figures, an additional tilt axis TA is also shown, which is not common for standard SEM stages. However, this axis can be added in some embodiments to form a so-called 6 axes stage, as it is described in Step L.

Step L:

Providing at least one additional tilt axis TA, wherein each of these additional tilt axes TA is non-parallel to all the other additional tilt axes TA and to the first tilt axis T1, and wherein if the rotation axes R are provided, each of these additional tilt axes TA is also non-parallel to all these rotation axes R, and providing means for tilt movement of the stage 6 about at least one additional tilt axis TA.

Typically, there is only one additional tilt axis TA, which is in the most common embodiment of the 6 axes stage perpendicular to both rotation axis R and first tilt axis T1, as it is shown in FIGS. 1*a*, 1*b*. However, more additional tilt axes TA can also be present, with different spatial orientations.

Many other axes of translation, rotation or tilt can be added as optional and various optional combinations of translational movements and/or rotational movements and/or tilt movements are generally possible for stages in electron microscopes. Many of these combinations may be successfully used to perform the invention according to the present disclosure. It should be appreciated by those skilled in the art that the number and the mutual inclination of these axes can vary without departing from the scope of the invention. To bring an added value to the stage performance, the axes are usually mutually non-parallel, i.e. if more rotation and/or tilt axis are present; all of them are non-parallel to the others. Mutually parallel tilt or rotation axes would not have a practical sense.

In one embodiment of the invention, use is made of a stage with two translational axes x and y and with one rotation axis R and one first tilt axis. It is a further advantage if a translational z-axis is added.

In another embodiment, in addition to the translational axes x and y to the rotation axis R and to the first tilt axis T1, there is also an additional tilt axis TA. Again, it is advantageous to provide the stage also with the translational movement along z-axis.

It is advantageous if the rotation axis R is perpendicular to the first tilt axis T1, as it is the case for standard SEM stages, see FIGS. 1a, 1b. If two tilt axes are present, all the rotation and tilt axes, i.e. the rotation axis R, the first tilt axis T1 and the additional tilt axis TA are mutually perpendicular, see FIGS. 1a, 1b. In FIG. 1a, a basic non-tilted position is shown. In FIG. 1b, the stage is tilted about the first tilt axis T1 with respect to the basic non-tilted position. In both Figs, the sample 4 is mounted on the sample stage 6. The bottom part of the illuminator 2 is schematically shown, together with its electron-optical axis 3 and objective lens OBJ. For sake of clarity, other elements of the illuminator, such as different coils, pole-pieces shape etc., are not shown or not marked, as they are well known to those skilled in the art. The detector 5 is placed below the illuminator in this embodiment. The working distance WD between the lower end of the illuminator, i.e. between lower end of the lower pole-piece of the objective lens OBJ and the sample 4 surface, is also shown. The BSEs emitted from the sample impinge upon the detector 5.

Typical SEM stages are provided with rotational movement about the rotation axis R of 360°, whereas the range of their tilt movements is more restricted. In one aspect of the invention, it is not necessary to make this difference in range between tilt and rotation, as in some aspects of the invention, the rotation of the stage necessary to carry out the invention will be just of order of several degrees, the complete rotation is by far not necessary in many cases. In fact, in the frame of this disclosure, both tilt and rotation should be understood as rotational movements about corresponding axes. The different terms "tilt" and "rotation" are used for the reader's convenience only, following the well-established nomenclature of the microscope stage movements.

Figure 8B:
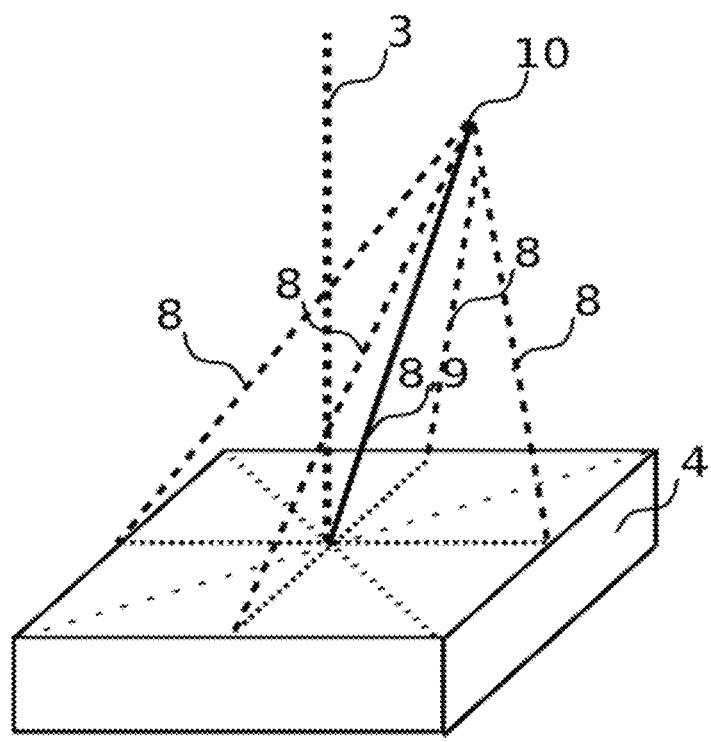
FIG. 8b shows a central axis of scanning when scanning with a tilted central impinging electron beam.

In several embodiments, the first tilt axis T1 is substantially perpendicular to a central axis 9 of scanning. The central axis 9 of scanning is defined in the scanning mode, i.e. when the primary electron beam scans the sample in two non-parallel directions, the directions being typically perpendicular. The central axis 9 of scanning is the central position of the axis of the primary electron beam impinging on the sample at half path between the extreme positions of the impinging electron beam during the scanning in two non-parallel directions, i.e. in most cases at half path between the "right extreme position" and the "left extreme position" and also at half path between the "back extreme position" and "front extreme position". Some possible positions of the central axis 9 of scanning are shown in FIGS. 8a, 8b. Note that the central axis 9 of scanning can be tilted with respect to the electron optical axis 3 (FIG. 8b). However, the central axis of scanning typically coincides with the electron optical axis 3 (FIG. 8a). It is noted that the scanning directions can also be non-perpendicular (not shown). The axis of the impinging primary electron beam is denoted by 8, the extreme positions of the axis of the impinging primary electron beam when scanning are illustrated by dashed lines.

Throughout this disclosure, the term "substantially perpendicular" is used to refer to a direction which does not deviate from 90° by more than 5°.

In one aspect of the present method, the step E of FIG. 7, i.e. the step of orienting the selected set of crystal lattice planes S1 to Bragg condition, includes the following sub-steps illustrated in the flowchart in FIG. 9 and described hereinafter:

Sub-Step E1:

Obtaining by means of one of the detectors 5 Electron Channeling Pattern (ECP) or Electron Back-Scattered Pattern (EBSP), the pattern including several sets of quasi-parallel dark lines called Kikuchi lines.

Sub-Step E2:

Selecting one set S1 of crystal lattice planes of the sample 1 by choosing one dark Kikuchi line L1 in the observed image, i.e. in the observed ECP or EBSP, the line L1 is any of the lines in the ECP or EBSP selected by the user in view of further study of the related crystalline lattice defects, the notation L1 being used to distinguish this user-selected line from the others. This dark Kikuchi line L1 corresponds to the electron channeling through one set of lattice planes of the sample that will be noted hereinafter as S1.

Sub-Step E3:

If the selected line L1 does not pass through the center of the observed image, setting the set S1 of crystal planes of the sample corresponding to the selected dark Kikuchi line L1 to Bragg condition by making the selected dark Kikuchi line L1 to pass through the center of the observed image by using at least one of the stage movements provided in the steps D, K and L, i.e. by tilting about the first tilt axis T1 and/or by rotating about at least one rotation axis R and/or by tilting about at least one additional tilt axis TA. That means that a combination of tilt or tilts and/or rotation or rotations of the stage can be used to this effect. By contrast, translational movements of the stage cannot be used in this step.

It is noted that when speaking about the position of a dark Kikuchi line throughout this disclosure, the center of the ECP or of the EBSP is also referred to as a center of the observed image. As known to the skilled person, ECP or EBSP looks different for every tilt. The center of the observed image is shown in FIG. 3.

When the line L1 passes through the center of the observed image, it means that the set of planes S1 corresponding to the line L1 is set to Bragg condition for ECC imaging. Consequently, when the line L1 runs through the center of the observed image, electron channeling contrast can be observed. In other words, this means that the selected set of planes S1 is diffracting in Bragg condition and that the crystal orientation is set and/or known. This further means that defects in the sample become best visible when the field of view/pixel resolution is such that it becomes possible to identify those defects.

ECC image can then be acquired, typically with high magnification and small field of view. Also, pixel resolution matters, it has to be sufficient to resolve the defects. Having the set of planes S1 at Bragg condition is necessary for getting a good contrast of the defects in the ECC image.

As a general rule in this invention, the ECP or the EBSP enables to orient the selected set of lattice planes to Bragg condition. The imaging that follows is the ECC imaging, which is realized typically just by zooming in the selected line L1 after the sample orientation is set. For example, if the sample is a single crystal and if the ECP are acquired by stage rocking or beam rocking, the ECC imaging is achieved by zooming in from a large field of view of 500-800 μm to a small 2-50 μm.

After the sub-steps E1, E2 and E3, the step F of the general procedure shown in FIG. 7 includes more particularly:

Obtaining by means of one of the detectors 5 Electron Channeling Contrast Image for an area of interest on the sample 4 chosen within the same dark Kikuchi line L1 as previously selected. This area of interest can be adjusted by using a translational movement of the sample stage 6 or a combination thereof, e.g. by the translational movement along the translational axes x and/or y, or more generally, by using translational movements in a plane whose normal encloses an angle in the range from +10° to −10° with the electron-optical axis 3. This step F is also illustrated in FIG. 9.

Similarly to the step E, it is advantageous if the step H of the general flowchart in FIG. 7 includes the following sub-steps:

Sub-Step H1:

Obtaining by means of one of the detectors 5 an ECP or an EBSP from the sample 4, the Pattern including several sets of quasi-parallel dark Kikuchi lines.

Sub-Step H2:

If the previously selected dark Kikuchi line L1 corresponding to the set S1 of crystal lattice planes does not pass through the center of the observed image, restoring the Bragg condition for this set S1 of crystal planes by making the selected dark Kikuchi line L1 to pass through the center of the image by using at least one of the stage movements provided in the steps D, K and L. Alternatively, the sub-step H2 can lead not exactly to the position in which the dark Kikuchi line L1 passes through the center of the image, but to a preliminary position from which this position can be obtained by tilting about the first tilt axis T1 which is done after the step H. In this case, the step H precedes the step G.

The sub-steps H1 and H2 are followed by step I of the general flowchart in FIG. 7. In this particular aspect of the invention, the step I includes:

Obtaining by means of one of the detectors 5 an ECC image for an area of interest within still the same dark Kikuchi line L1 as previously selected. This area of interest at least partly overlaps the area of interest selected in the preceding ECC image obtaining step and its position can be adjusted by using a translational movement of the sample stage 6 or a combination of such movements. Generally, translational movements in a plane whose normal encloses an angle in the range from +10° to −10° with the electron-optical axis 3 will be used for this adjustment, and more specifically, the translational movements along the translational axes x and/or y as shown in FIGS. 1a, 1b.

Figure 10:
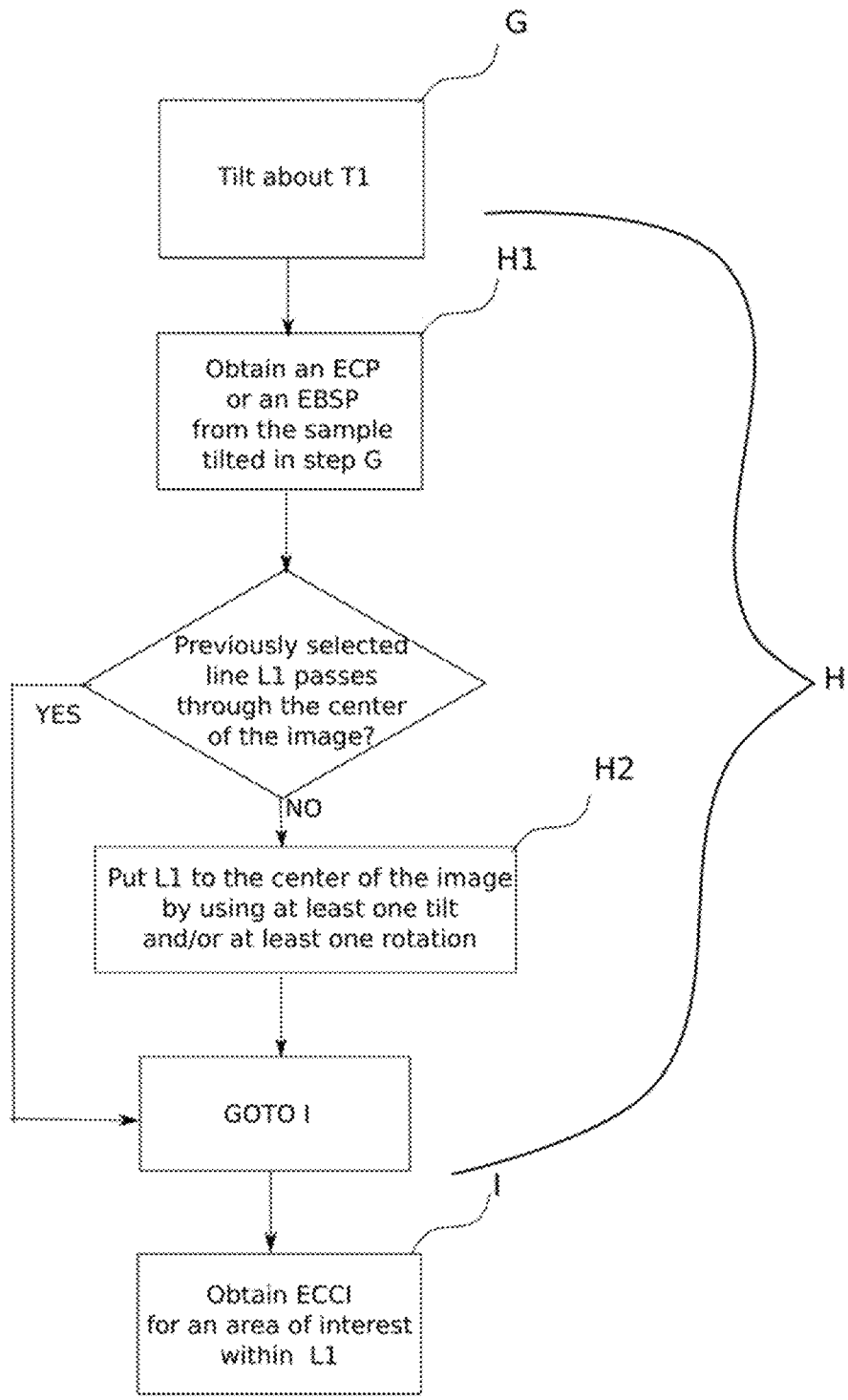
FIG. 10 is a schematic flowchart of the use of ECP/EBCP patterns for in orienting a set of lattice planes to Bragg condition in the main part of the typical general procedure of FIG. 7.

The sub-steps H1 and H2 together with the step I according to the preceding description are depicted in the flowchart of FIG. 10. The step G which in this depicted embodiment precedes the steps H1 and H2 is also shown. For sake of clarity, the alternative version of the sub-step H2 in which the dark Kikuchi line L1 is set to a preliminary position from which it can be made to pass through the center of the image by tilting about the first tilt axis T1, is not shown in FIG. 10.

Throughout the whole procedure of steps from E to I which includes all the repetitions of the sequence of steps from G to I and comprises the above-mentioned sub-steps E1, E2, E3, H1, H2, the spatial distribution of the visible defects is studied, which means that still the same line L1 is repeatedly brought to the center of the observed ECP or EBSP. Generally speaking, the stage movements used to bring the line L1 to the center of ECP or EBSP include rotation about at least one rotation axis R and/or tilt about at least one tilt axis T1, TA.

In an embodiment, the first tilt axis T1 is substantially perpendicular to a central axis of scanning 9 which typically but not necessarily coincides with the electron-optical axis 3, see FIGS. 8a, 8b. An example of such first tilt axis T1 is shown e.g. in FIGS. 1a, 1b.

In this configuration, if the projection on the sample surface of the dark Kikuchi line L1 selected in the step E2 is not perpendicular or substantially perpendicular to the first tilt axis T1, it is advantageous to perform a sequence of steps E2.1. The "projection on the sample surface of the dark Kikuchi line" should be understood not as a projection literally speaking, but as a line on the sample surface that corresponds to the selected line L1, i.e. the line on the sample that gave origin to the dark Kikuchi line L1 on the screen where the image acquired by the detector 5 is observed.

The sequence of steps E2.1 includes the following steps:

Setting the sample stage 6 to a position $\tau_0$ in which a scanned surface of the sample 4 is perpendicular to the central axis 9 of scanning.

Checking whether the line on the sample from which originates the dark Kikuchi line L1 on the screen is substantially perpendicular to the first tilt axis T1 and if not, making said projection on the sample surface of the line L1 perpendicular or substantially perpendicular to the first tilt axis T1 by using at least one of the stage movements provided in step K, i.e. rotation or rotations about one or more rotation axes.

Figure 11A:
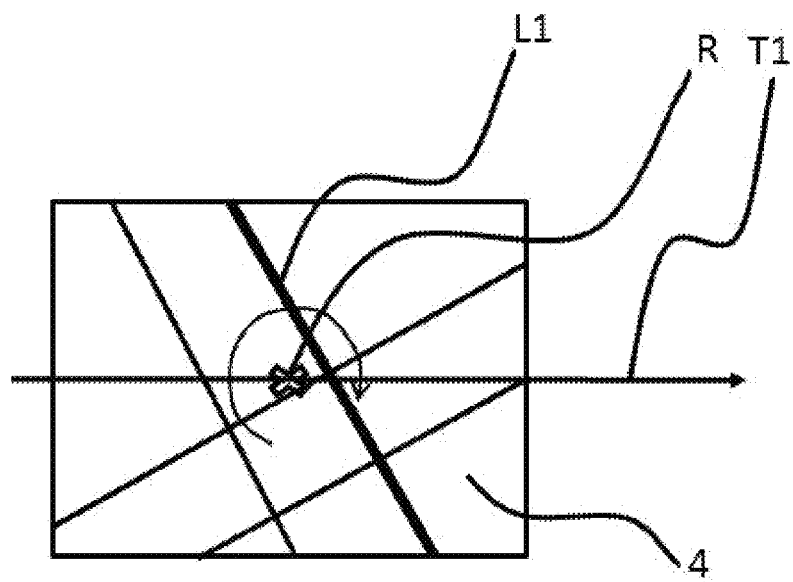
FIG. 11a, 11b illustrate how the projection on the sample surface of the line L1 is made perpendicular to the first tilt axis T1; the measurement of the parameter a of formula (1) is also shown.
Figure 11B:
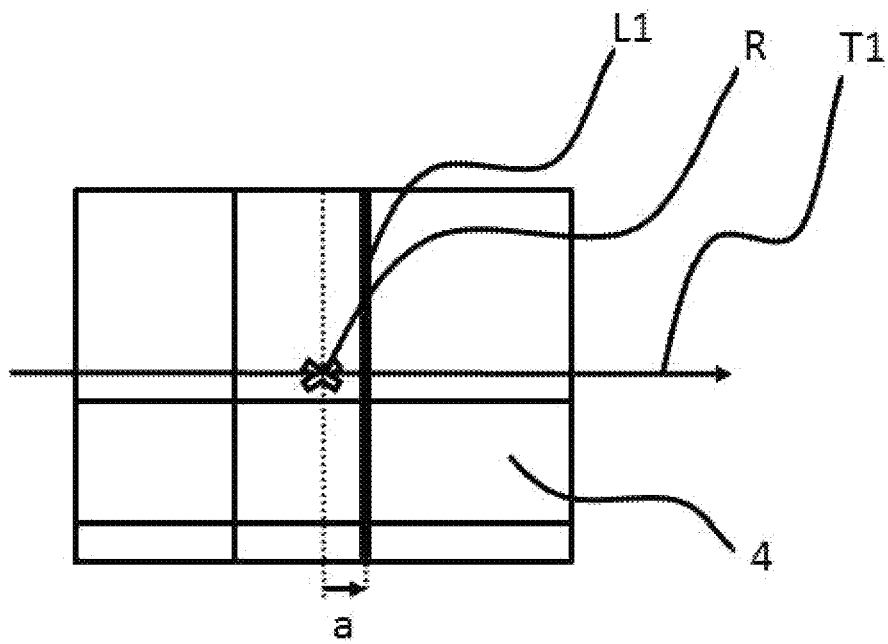

Then, in this position of the sample stage 6, distance a of the dark Kikuchi line L1 from the center of the observed image is measured, where the distance a is positive if the dark Kikuchi line L1 is on the left starting from the center of the observed image, and vice-versa. An example of initial sample orientation, and consequently, of the ECP/EBSD pattern projection on the sample surface orientation, before the sequence E2.1 of steps is shown in FIG. 11a. The projection of the user-selected line on the sample surface is marked as L1. Three other lines are schematically shown to illustrate a part of the ECP or EBSD pattern. One of the aims of the sequence E2.1 of steps is to make the projection of the line L1 on the sample surface substantially perpendicular to the first tilt axis T1. The position of the line after the sequence E2.1 of steps, in which a rotation about one rotation axis R was performed, is shown in FIG. 11b. In FIG. 11b, the projection of line L1 on the sample surface is perpendicular to the first tilt axis T1. Measuring distance a of the user-selected dark Kikuchi line L1 from the center of the observed image is also shown in FIG. 11b. The measured distance a is positive if the dark Kikuchi line L1 is on the left starting from the center of the observed image, and vice-versa. Consequently, in the example shown in FIG. 11b, the distance a is negative.

Making the line L1 perpendicular to the first tilt axis and/or measuring the distance a is advantageous in some stage embodiments, as it will be described below.

In some embodiments, it is advantageous to insert said sequence E2.1 of steps between the step E2 and the step E3, i.e. the projection of line L1 on the sample surface is made perpendicular to the first tilt axis T1 and the distance a is measured before starting the tilt series.

It should be noted that many possible configurations of the stage movements can be used to perform the invention. The number and the positions of the tilt and rotation axes can vary. For example, a number of pairs of mutually perpendicular tilt axes T1, TA can be used, each of these pairs being perpendicular to one of the rotation axes R. However, it is more practical to use the standard stages, as it will be described hereinafter in the paragraphs Embodiment 1 (one first tilt axis T1 and one rotation axis R) and Embodiment 2 (two tilt axes T1, TA and one rotation axis R).

Embodiment 1

In this embodiment, the basic standard configuration of the sample stage 4 is used, this configuration being available in most of the current SEMs. The sample stage 6 is provided with the first tilt axis T1 which is perpendicular or substantially perpendicular to the central axis of scanning. The sample stage 6 is also provided with a rotation axis R perpendicular or substantially perpendicular to the first tilt axis T1. If the projection on the sample surface of the dark Kikuchi line L1 selected in the step E2 is not perpendicular to the first tilt axis T1, the sequence of steps E2.1 is inserted between the step E2 and the step E3. One of the objectives of the sequence of steps E2.1 is to make the projection on the sample surface of said line L1 perpendicular or substantially perpendicular to the first tilt axis T1. In this embodiment, rotation about rotation axis R is chosen to this end. In FIG. 11a, an example of an initial position of the sample 4 with an ECP projected on it is shown. The rotation axis R is perpendicular to the sample plane; the first tilt axis T1 is parallel to it and perpendicular to R. As the projection on the sample surface of the user-selected line L1 is not perpendicular to T1 in the initial position of the sample in FIG. 11a, a rotation about the rotation axis R is performed to change this. By rotating the sample stage 6 with the sample 4 about the rotation axis R, the projection on the sample surface of the line L1 is made perpendicular to the first tilt axis T1, as it is shown in FIG. 11b. The position of T1 is known to the user from the configuration of the sample stage in this particular case.

The scanning type electron microscopes have a scanning pivot point, i.e. a point around which the primary electron beam "pivots" when scanning across the sample surface, and so it is in the case of the scanning type electron microscope used in this invention. The scanning pivot point is typically close to the principal plane of the objective lens of the microscope. The scanning point is denoted by 10 in the images.

A sequence of steps E2.2 is also performed in this embodiment. This sequence includes:
calculating an angle of rotation φ in radians about the rotation axis R using the formula:

$$\varphi = \sin^{-1}\left(\frac{a}{p\tan(\tau_{FORM})}\right) \quad (1)$$

in which:
a is the distance of the user-selected dark Kikuchi line L1 from the center of the observed image measured in step E2.1
positive sign of calculated φ means clockwise rotation and vice-versa,
$\tau_{FORM}$ is a user-selected angle between the central axis (9) of scanning and a normal to a scanned surface of the sample (4) in radians
p is the distance from the scanning pivot point 10 of the microscope to a point which corresponds to the center of the observed image on a scanned surface of the sample (4).
In (1), p and a are measured in the same units.

The scanning pivot point 10 and the distance p are shown in FIGS. 2 and 8a. It can be seen that the distance p corresponds to the distance between the scanning pivot point 10 and the intersection of the central axis of scanning 9 or of the electron-optical axis 3 with the scanned surface of the sample 4.

The distance a of the user-selected dark Kikuchi line L1 from the center of the observed image is measured in the sequence of steps E2.1, as it was explained before and as it is shown in FIG. 11b.

The tilt angle τ about the axis T1 is selected by the user to perform the tilt-ECCI series.

There are 2 possibilities how to use the formula (1) calculated in step E2.2:
1) If the sequence of steps E2.1 was inserted between the step E2 and the step E3, the formula of E2.2 can be used to set the Bragg condition before the first passing through the cycle G-I. In this case, the stage movements used in step E3 for making the selected dark Kikuchi line L1 to pass through the center of the observed image, include rotating the sample stage 6 with the sample 4 about the rotation axis R by rotation angle φ calculated according to the formula (1) in step E2.2 for a user-selected angle $\tau_{FORM}$, and tilting the sample stage 6 with the sample 4 about the axis T1 to a position in which the central axis 9 of scanning and the normal to the scanned surface of the sample 4 enclose the angle $\tau_{FORM}$, which is the same as the tilt angle $\tau_{FORM}$ used in the calculation of φ in the step E2.2. This tilting and rotating can be done in an arbitrary order 2) The formula is used in the cycle G-I, either in combination with using the formula before starting the cycle from G to I, or without using it before starting this cycle. The calculation of the step E2.2. is performed to get the values of tilt angle τ to perform the tilt series in step G and also to make the selected dark Kikuchi line L1 to pass through the center of the observed image in step H2 or to put the dark Kikuchi line L1 to a preliminary position from which it can be made to pass through the center of the image by tilting about the first axis T1. The step E2.2 is repeated n-times for different user-selected angles $\tau_{FORM,i}$ with i being a member of an integer sequence from 1 to n and n being equal to the number of repetitions of step G. In such a way, a series of tilt angles about T1 is set up, each tilt angle having a corresponding synergic rotation angle about the rotation axis R calculated according to the formula (1) which will lead to restoring the Bragg condition.

In the i-th repetition of step G, the sample stage (6) with the sample 4 is tilted by an angle τ about the first tilt axis T1, the angle τ being such that after this tilt in the step G, the value of the angle between the central axis (9) of scanning and a normal to the scanned surface of the sample (4) equals $\tau_{FORMi}$ wherein $\tau_{FORMi}$ is the tilt angle used in the i-th the repetition of the step E2.2.

The stage movements used in i-th repetition of the step H2 for making the selected dark Kikuchi line L1 to pass through the center of the observed image or to put it to a preliminary position from which the line L1 can be made to pass through the center of the image just by tilting the stage 6 with the sample 4 about the first tilt axis T1, include rotating by rotation angle φ about the rotation axis R, with rotation angle φ calculated in the step E2.2 for $\tau_{FORM}=\tau_{FORMi}$. If the line L1 does not pass precisely through the center of the observed image after this rotation and tilt about the first tilt axis T1 to the angle $\tau_{FORMi}$, a small corrective tilt about the first tilt axis T1 can be added.

This procedure is schematically shown in FIGS. 12a-c for the above-mentioned possibility 2), but the patterns would be similar also for the case 1). The positions of the axes R and T1 are the same as in FIGS. 11a, 11b. FIG. 12a shows the position of the line L1 after the sequence of steps E2.1. This is just one example of a starting position for the first passing of the sequence of steps from G to I. In other cases, the starting position before steps G and H can be different, with the line L1 not necessarily parallel to the first tilt axis T1. FIG. 12b shows the position of the line L1 after rotating by angle φ about the rotation axis R in step H2. And finally, FIG. 12c shows the position of the line L1 after tilting by angle τ about the tilt axis T1 in step G: the goal is achieved, the line L1 passes though the center of the observed ECP or EBSP, the set of crystal lattice planes S1 corresponding to this line L1 is in Bragg condition and the sample is prepared for the ECCI acquisition in the step I.

Note that in this embodiment, once the tilt angles for the tilt series about the first tilt axis T1 are calculated, it is indifferent if the procedure of steps G, H starts by step G with tilting about the first tilt axis T1 by an angle τ that corresponds to $\tau_{FORMi}$ followed by step H including rotation about the rotation axis R by an angle that corresponds to the angle φ calculated according to the formula for given $\tau_{FORMi}$ or vice-versa, i.e. the procedure of steps G, H can also start by H including the rotation about the axis R by an angle that corresponds to the angle φ calculated according to the formula for a user-selected $\tau_{FORMi}$, followed by step G, i.e. by tilting about the first tilt axis T1 by angle τ that corresponds to $\tau_{FORMi}$ The latter is shown in FIGS. 12b, 12c.

The angle τ is considered as a relative tilt about T1 with respect to the preceding position of the sample stage, i.e. an angle that the sample surface encloses with the preceding position of its surface. On the other hand, the angles FORM and $\tau_{FORMi}$ are absolute values of angles measured between the central axis 9 of scanning and a normal to the scanned surface of the sample 4. Tilting about the first tilt axis T1 by an angle τ of that corresponds to $\tau_{FORM}$ or $\tau_{FORMi}$ means that by tilting by τ, the sample stage moves in such a position in which the angle between the central axis 9 of scanning and a normal to a scanned surface of the sample 4 equals $\tau_{FORM}$ or $\tau_{FORMi}$.

The rotation according to FIG. 12b and the tilt according to FIG. 12c can also be performed as a part of the step E3. In this case as well, the order of rotation and tilt can be inversed.

If the sequence of steps from G to I is repeated, in each repetition of the step G, the line L1 gets out of the center of the observed image and the diffraction conditions need to be restored, e.g. by repeating the above-described procedure of tilting and rotating by angles calculated by the formula (1).

In each step I, the ECCI image is acquired for a different tilt angle due to the tilts in step G and/or in step H2.

Embodiment 2

In this embodiment, the means according to the steps J, K and L are provided. Among the additional tilt axes TA provided in the step L, there is an axis denoted as a second tilt axis T2 that is substantially perpendicular the first tilt axis T1, and both mutually substantially perpendicular tilt axes T1, T2 are also substantially perpendicular to one of the rotation axes R. The additional axis TA shown in FIG. 1a or in FIG. 1b is equivalent to the second tilt axis T2 according the preceding definition.

Figure 9:
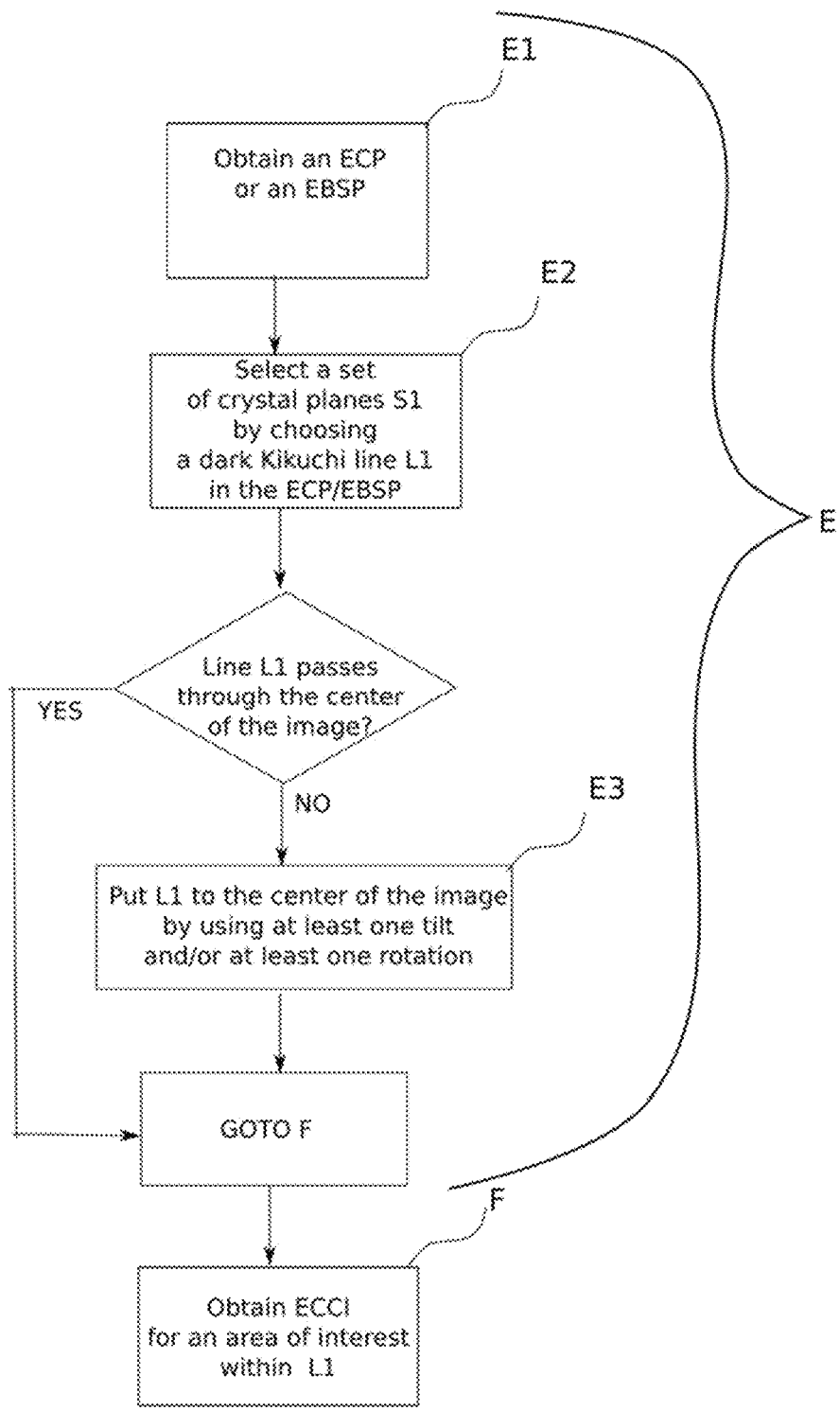
FIG. 9 is a schematic flowchart of the use of ECP/EBCP patterns for in orienting a set of lattice planes to Bragg condition in the starting part of the general procedure of FIG. 7.

In this embodiment, the sub-steps E1, E2 and E3 are performed according to FIG. 9, followed by the step F according to still the same figure, and by the steps according to FIG. 10, i.e. G, H1, H2 and I, with possible repetition of the steps from G to I.

The stage movements used in the step E3 or in the first passing through the step H2 for making the selected dark Kikuchi line L1 to pass through the center of the observed image include rotating about the rotation axis R which is substantially perpendicular to both tilt axes T1, T2, wherein the rotation angle about the rotation axis R is such that the selected dark Kikuchi line L1 projected on the sample is made perpendicular to the first tilt axis T1 by this rotation, and/or tilting about the second tilt axis T2 by an angle that moves the selected dark Kikuchi line L1 to the center of the observed image. The rotation about the rotation axis R is not necessary if the projection on the sample surface of the line L1 is perpendicular to the first tilt axis T1 in the initial position of the sample.

In the following, the most current configuration with one rotation axis R and two tilt axes T1, T2 will be considered.

In a SEM set according to the steps A to D, the steps from E to F are performed as described before, with some additional steps as for example E2.1 inserted in case of need. Then, a tilt about the first tilt axis T1 is performed in step G. In each repetition of the sequence of steps from G to I, the tilt angle about the first tilt axis T1 may change.

It is advantageous to put the line L1 to a position such that it passes through the center of the observed image even when the tilt about the first axis T1 is modified. This can be ensured either during the first passing through the sequence of the steps from G to I, or even before the first passing though this sequence of steps.

In the first case: during the first passing through the steps from G to I, the stage movements used in the step H2 for making the selected dark Kikuchi line L1 to pass through the center of the observed image include rotation about the rotation axis R, which is substantially perpendicular to both tilt axes T1, T2, and tilting about the second tilt axis T2. The rotation about the rotation axis R is used to make the projection on the sample surface of the line L1 perpendicular to the first tilt axis T1. This leads to the position shown in FIG. 13a, where the tilt and rotation axes is also illustrated. In FIG. 13b, the line L1 was moved to the center of the image by tilting about the second tilt axis T2 by an appropriate angle. Then if after the step I, the sequence of steps from G to I is repeated, the line L1 stays in the center of the observed image even after a new tilting in step G—tilting about the first axis T1 does not move the line L1 from the center of the image any more. The image similar to that in FIG. 13c will be thus observed after each tilt about the first tilt axis T1 after each further repetition of the step G.

In the latter case: the line L1 can be brought to the center of the image in step E3 by rotating about the rotation axis R as shown in FIGS. 11a, 11b to make the projection of the line L1 on the sample surface perpendicular to the first tilt axis T1, i.e. to get to the position shown in FIG. 13a, and then by tilting about the second tilt axis T2. If an appropriate angle is selected, the result of such a tilting would look like the pattern shown in FIG. 13b. Then, even if the sample is repeatedly tilted about the first tilt axis T1 in the step G, the line L1 remains in the center of the image.

Again, a series of ECCI images acquired for different tilt angles about the first tilt axis T1 can be accumulated by a method according to this embodiment.

It should be noted that the method described in Embodiment 2 can be performed also in a microscope having a sample stage 6 provided with more than two tilt axes and more than one rotation axis. To perform the method according to Embodiment 2, two of the tilt axes present will be selected. These selected axes should be perpendicular or substantially perpendicular to each other and also perpendicular to one of the rotation axes of the stage. One of the selected tilt axes which is referred to as a first tilt axis T1 should be perpendicular to the central axis of scanning.

Embodiment 3

In one embodiment of the invention, two ECCI are acquired for two different sample stage 6 tilt angles about the first tilt axis T1. These images, typically obtained in steps F and I for the corresponding tilt angles, are then stereoscopically viewed which allows for observation of the crystalline lattice defects in 3D. To have 2 ECCI images for 2 different tilt angles, the sequence of steps from G to I can be repeated only once, as in step G and/or in step H the tilt angle changes. As a result, the images obtained in steps F and I are acquired with different tilt angles.

Embodiment 4

In yet another embodiment of the invention, for a more thorough 3D reconstruction of the defects, the sequence of steps from G to I can be repeated more than once. The user sets a number n of repetitions of the sequence of steps from G to I, the number n being higher than one. The sequence of steps from G to I is then repeated n-times. For each repetition i of the step I, the total tilt angle $\tau_{TOTi}$ about the first tilt axis T1 is calculated. The total tilt angle $\tau_{TOTi}$ is a sum of all the tilt angles corresponding to the sample stage 6 tilts about the first tilt axis T1 performed before the i-repetition of step I, whereby i is a member of an integer sequence from 1 to n. The Electron Channeling Contrast Image obtained in the $i^{th}$-repetition of step I is noted as $ECCI_i$, whereby i has the same meaning, i. e it is a member of an integer sequence from 1 to n.

A measurement set of $\{(\tau_{TOTi}, ECCIi)\}$ is then compiled and is used for 3D reconstruction of crystal lattice defects by mathematical methods.

Although the present invention and its advantages have been described in detail, it should be understood that various changes, substitutions and alterations can be made herein without departing from the invention as defined by the appended claims. Moreover, the present application is not intended to be limited to the particular embodiments described in the specification. As one of ordinary skill in the art will readily appreciate from the disclosure of the present invention, embodiments presently existing or later to be developed that perform substantially the same function or achieve substantially the same result as the corresponding embodiments described herein may be utilized according to the present invention. Accordingly, the appended claims are intended to include such embodiments.

INDUSTRIAL APPLICABILITY

The method according to the present disclosure can be used for 3D assessment of defects in monocrystalline samples or inside individual grains of a polycrystalline material. The defects such as dislocations, stacking faults, point defects etc., and their propagation through the material can be studied. This is important in many fields of industry, including semiconductor industry, where the method is particularly suitable for studying semiconductor heterostructures, or in metallurgy to study e.g. fatigued metals. Many other applications are also possible.

The method according to the present disclosure is non-destructive and much faster than other 3D visualization techniques. It allows for visualization of large areas of interest.

The method described herein may be described by the following clauses:

Clause 1. A method of 3D defect characterization of crystalline samples in a scanning type electron microscope, comprising the following steps:
  A. Providing a sample stage (6) for holding a sample (4), and mounting said sample (4) on the stage (6);
  B. Providing an electron source producing a primary electron beam (1), providing an illuminator (2) having an electron-optical axis (3), and directing the primary electron beam (1) through the illuminator (2) so as to irradiate sample (4), thereby producing an interaction that causes particle radiation to emerge from the sample (4), the radiation including backscattered electrons (BSEs);
  C. Providing at least one detector (5) to detect the BSEs resulting from the interaction of the primary electron beam (1) with the sample (4);
  D. Providing first tilt axis (T1) and providing means for tilt movement of the stage (6) about the first tilt axis (T1);
  E. Selecting one set (S1) of crystal lattice planes of the sample (1) and orienting this set (S1) to Bragg condition with respect to the primary electron beam (1) impinging on the sample (4);
  F. Obtaining by means of one of the detectors (5) Electron Channeling Contrast Image for an area of interest on the sample (4)
  the method being characterized in that it further comprises repeating the following steps:
  G. Tilting the sample stage (6) with the sample (4) by user-selected angle about the first tilt axis (T1);
  H. If Bragg condition is not fulfilled for the previously selected set (S1) of crystal lattice planes, making a sample stage (6) movement or movements leading to restoring the Bragg condition for this set (S1) of crystal lattice planes, wherein this restoring does not consist of a simple reverse tilting by –τ and wherein the sample stage (6) is provided with means to realize the said movement or movements;
  I. After steps G and H, obtaining by means of one of the detectors (5) Electron Channeling Contrast Image for an area of interest on the sample (4), wherein this area of interest at least partly overlaps the area of interest selected in the preceding Electron Channeling Contrast Image obtaining step;
  until the number of repetitions of the steps G and I equals n, where n is a user-selected integer.

Clause 2. The method of clause 1, wherein for orienting the set (S1) of crystal lattice planes to Bragg condition in steps E and/or H, use is made of Electron Channeling pattern or Electron Bacscattered Pattern acquired by one of the detectors (5).

Clause 3. The method of clauses 1 or 2, further comprising the following steps:
  J. Providing means for translational movement of the stage (6) in a plane whose normal encloses an angle in the range from +10° to −10° with the electron-optical axis (3);
  K. Providing at least one rotation axis (R), each of these rotation axes (R) being non parallel to all the others rotation axes (R) and to the first tilt axis (T1), and providing means for rotational movement of the stage (6) about at least one rotation axis (R).

Clause 4. The method according to any of clauses 1-3, further comprising a step:

L. Providing at least one additional tilt axis (TA), wherein each of these additional tilt axes (TA) is non parallel to all the others additional tilt axes (TA) and to the first tilt axis (T1), and wherein if the rotation axes (R) are provided, each of these additional tilt axes (TA) is also non parallel to all these rotation axes (R), and providing means for tilt movement of the stage (6) about at least one additional tilt axis (TA).

Clause 5. The method of clauses 3 or 4, wherein:

the step E includes the following sub-steps:

E1 Obtaining by means of one of the detectors (5) Electron Channeling Pattern or Electron Bacsscattered Pattern, the pattern including several sets of quasi-parallel dark lines called Kikuchi lines;

E2 Selecting one set (S1) of crystal lattice planes of the sample (1) by choosing one dark Kikuchi line (L1) in the observed image E3 If the selected line (L1) does not pass through the center of the observed image, setting the set (S1) of crystal planes of the sample corresponding to the selected dark Kikuchi line (L1) to Bragg condition by making the selected dark Kikuchi line (L1) to pass through the center of the observed image by using at least one of the stage movements provided in the steps D, K and L;

the step F includes:

Obtaining by means of one of the detectors (5) Electron Channeling Contrast Image for an area of interest on the sample (4) chosen within the same dark Kikuchi line (L1) as previously selected, wherein this area of interest can be adjusted by using a translational movement of the sample stage (6) or a combination thereof;

the step H includes the following sub-steps:

H1 Obtaining by means of one of the detectors (5) Electron Channeling Pattern or Electron Bacsscattered Pattern from the sample (4) the Pattern including several sets of quasi-parallel dark Kikuchi lines;

H2 If the previously selected dark Kikuchi line (L1) corresponding to the set (S1) of crystal lattice planes does not pass through the center of the observed image, restoring the Bragg condition for this set (S1) of crystal planes by making the selected dark Kikuchi line (L1) to pass through the center of the observed image by using at least one of the stage movements provided in the steps D, K and L or using at least one of the stage movements provided in steps D, K and L to put the dark Kikuchi line (L1) to a preliminary position from which it can be made to pass through the center of the image by tilting about the first axis T1;

and wherein the step I includes:

Obtaining by means of one of the detectors (5) Electron Channeling Contrast Image for an area of interest within still the same dark Kikuchi line (L1) as previously selected, wherein the position of the area of interest can be adjusted by using a translational movement of the sample stage (6) or a combination thereof.

Clause 6. The method according to any of clauses 1-5, wherein the first tilt axis (T1) is substantially perpendicular to a central axis of scanning (9) which typically coincides with the electron-optical axis (3).

Clause 7. The method of clause 6, comprising a sequence of steps E2.1, the sequence E2.1 including:

Setting the sample stage (6) to a position to in which a scanned surface of the sample (4) is perpendicular to the central axis (9) of scanning;

Checking whether the projection of the dark Kikuchi line (L1) selected in the step E2 on the sample surface is perpendicular or substantially perpendicular to the first tilt axis (T1) and if not, making said projection of line (L1) perpendicular or substantially perpendicular to the first tilt axis (T1) by using at least one of the stage movements provided in step K; and in this sample stage (6) position measuring distance a of the dark Kikuchi line (L1) from the center of the observed image, where the measured distance (a) is positive if the dark Kikuchi line (L1) is on the left starting from the center of the observed image, and vice-versa.

Clause 8. The method of clause 7, wherein the sequence of step E2.1 is inserted between the step E2 and the step E3.

Clause 9. The method according to clause 8, wherein the rotation axis (R) is substantially perpendicular to the first tilt axis (T1) and the electron microscope has a scanning pivot point (10), further including the step:

E2.2—Calculating an angle of rotation φ in radians about the rotation axis (R) using the formula:

$$\varphi = \sin^{-1}\left(\frac{a}{p\tan(\tau_{FORM})}\right)$$

in which:

a is the distance of the user-selected dark Kikuchi line (L1) from the center of the observed image measured in step E2.1, positive sign of calculated φ means clockwise rotation and vice-versa, $\tau_{FORM}$ is a user-selected angle between the central axis (9) of scanning and a normal to a scanned surface of the sample (4) in radians p is the distance from the scanning pivot point (10) of the microscope to a point which corresponds to the center of the observed image on a scanned surface of the sample (4).

Clause 10. The method of clauses 8 and 9, wherein the stage movements used in step E3 for making the selected dark Kikuchi line (L1) to pass through the center of the observed image, include rotating the sample stage (6) with the sample (4) by rotation angle φ calculated in step E2.2 about the rotation axis (R) for a user-selected angle $\tau_{FORM}$, and tilting about the first tilt axis (T1) to a position in which the central axis (9) of scanning and a normal to a surface of the sample (4) enclose the angle $\tau_{FORM}$, which is the same as the tilt angle $\tau_{FORM}$ used in step E2.2.

Clause 11. The method of clauses 9 or 10, wherein the step E2.2 is repeated n-times for different user-selected angles $\tau_{FORM}$, with i being a member of an integer sequence from 1 to n and n being equal to the number of repetitions of step G, while in the i-th repetition of step G the sample stage (6) with the sample (4) is tilted by an angle t about the first tilt axis (T1), the angle τ being such that after this tilt in the step G, the value of the angle between the central axis (9) of scanning and a normal to the scanned surface of the sample (4) equals $\tau_{FORMt}$, wherein $\tau_{FORMt}$ is the tilt angle used in the i-th repetition of the step E2.2, and wherein the stage movements used in i-th repetition of the step H2 for making the selected dark Kikuchi line (L1) to pass through the center of the observed image or for putting the dark Kikuchi line (L1) to a preliminary position from which it can be made to pass through the center of the image by tilting about the first axis T1; include:

rotating by rotation angle φ about the rotation axis (R), with rotation angle φ calculated in the step E2.2 for $\tau_{FORM} = \tau_{FORMr}$.

Clause 12. The method of clauses 3 to 6, wherein at least one additional tilt axis (TA) is provided such that among these additional tilt axes (TA), there is an axis denoted as a second tilt axis (T2) that is substantially perpendicular the first tilt axis (T1), and both mutually substantially perpendicular tilt axes (T1, T2) are also substantially perpendicular to one of the rotation axes (R), and wherein the stage movements used in the step E3 or in the first passing through the step H2 for making the selected dark Kikuchi line (L1) to pass through the center of the observed image include rotating about the rotation axis (R) which is substantially perpendicular to both tilt axes (T1, T2), wherein the rotation angle about the rotation axis (R) is such that the selected dark Kikuchi line (L1) projected on the sample is made perpendicular to the first tilt axis (T1) by this rotation, and/or tilting about the second tilt axis (T2) by an angle that moves the selected dark Kikuchi line (L1) to the center of the observed image.

Clause 13. The method according to any of clauses 1-12, wherein two Electron Channeling Contrast Images are acquired for two different sample stage (6) tilt angles about the first tilt axis (T1), the method further including stereoscopic viewing of these two images.

Clause 14. The method according to any of clauses 1-12 further comprising:

setting a number n of repetitions of the sequence of steps from G to I by a user, the number n being higher than one;

repeating the sequence of steps from G to I n-times;

for each repetition i of step I, calculating the total tilt angle $\tau_{TOTi}$ about the first tilt axis (T1), wherein the total tilt angle $\tau_{TOTi}$ is a sum of all the tilts about the first tilt axis (T1) performed before the i-repetition of step I, and noting $ECCI_i$ the Electron Channeling Contrast Image obtained in the i-repetition of step I, whereby i is a member of an integer sequence from 1 to n;

compiling a measurement set of $\{(\tau_{TOTi}, ECCIi)\}$ and using this set for 3D reconstruction of crystal lattice defects by mathematical methods.

We claim as follows:

1. A method of 3D defect characterization of crystalline samples in a scanning type electron microscope, said scanning type electron microscope comprising:

a sample stage for holding a sample;

an electron source for producing a primary electron beam, as well as an illuminator having an electron-optical axis, wherein said electron microscope is arranged for directing said primary electron beam through the illuminator so as to irradiate said sample for producing an interaction that causes particle radiation to emerge from the sample, said radiation including backscattered electrons (BSEs); and at least one detector for detecting said BSEs;

wherein said method comprises the step of:

irradiating said sample-provided on said stage;

selecting one set of crystal lattice planes of the sample;

orienting said set of crystal lattice planes to a first Bragg condition with respect to the primary electron beam impinging on said sample;

obtaining by means of said at least one detector a first Electron Channeling Contrast Image for a first area of interest on the sample;

orienting the set of crystal lattice planes to a second Bragg condition, by at least tilting the sample stage about a first tilt axis;

obtaining by means of said at least one detector a second Electron Channeling Contrast Image for a second area of interest on the sample while maintaining said second Bragg condition, wherein said second area of interest at least partly overlaps a previously selected area of interest;

wherein at least one of (i) the orienting the set of crystal lattice planes to the first Bragg condition and (ii) the orienting the set of crystal lattice planes to the second Bragg condition is performed based at least in part on an observed image, the observed image corresponding to an Electron Channeling Pattern or an Electron Back-Scattered Pattern acquired by one of the detectors.

2. Method according to claim 1, wherein the step of obtaining by means of said at least one detector the first Electron Channeling Contrast Image for said first area of interest on the sample comprises the following sub-steps:

obtaining by means of one of the detectors one or both of a third Electron Channeling Pattern and a third Electron Back-Scattered Pattern, wherein the one or both of the third Electron Channeling Pattern and the third Electron Back-Scattered Pattern include several sets of quasi-parallel dark lines called Kikuchi lines;

selecting the one set of crystal lattice planes of the sample by choosing one Kikuchi line in the one or both of the third Electron Channeling Pattern and the third Electron Back-Scattered Pattern; and setting the set of crystal planes of the sample corresponding to the selected Kikuchi line to the first Bragg condition by making the selected Kikuchi line to pass through the center of the one or both of the third Electron Channeling Pattern and the third Electron Back-Scattered Pattern.

3. Method according to claim 2, comprising the step:

obtaining by means of one of the detectors a fourth Electron Channeling Contrast Image for an additional area of interest on the sample chosen within the same dark Kikuchi line as previously selected.

4. Method according to claim 2, comprising the step:

obtaining by means of one of the detectors one or both of a fourth Electron Channeling Pattern and a fourth Electron Back-Scattered Pattern from the sample, wherein the one or both of the fourth Electron Channeling Pattern and the fourth Electron Back-Scattered Pattern include several sets of quasi-parallel Kikuchi lines; and if the previously selected Kikuchi line corresponding to the set of crystal lattice planes does not pass through the center of the one or both of the fourth Electron Channeling Pattern and the fourth Electron Back-Scattered Pattern, restoring the first Bragg condition for this set of crystal planes by making the selected Kikuchi line to pass through the center of the one or both of the fourth Electron Channeling Pattern and the fourth Electron Back-Scattered Pattern.

5. Method according to claim 4, comprising the step obtaining by means of one of the detectors a fifth Electron Channeling Contrast Image for an additional area of interest within still the same Kikuchi line as previously selected.

6. Method according to claim 1, wherein said first tilt axis is substantially perpendicular to at least one of a central axis of scanning and said electron-optical axis.

7. Method according to claim 6, comprising a sequence of steps including:
  setting the sample stage to a position $\tau_o$ to in which a scanned surface of the sample is perpendicular to the central axis of scanning;
  checking whether the projection of the dark Kikuchi line on the sample surface is perpendicular or substantially perpendicular to the first tilt axis, and, if not, making said projection of line perpendicular or substantially perpendicular to the first tilt axis; and
  in this sample stage position measuring distance a of the dark Kikuchi line from the center of the observed image, where the measured distance (a) is positive if the dark Kikuchi line is on the left starting from the center of the observed image, and vice-versa.

8. Method according to claim 1, wherein a rotation axis of the sample is substantially perpendicular to the first tilt axis and the electron microscope has a scanning pivot point, the method further including the step:
  calculating an angle of rotation φ in radians about the rotation axis (R) using the formula:

$$\varphi = \sin^{-1}\left(\frac{a}{p\tan(\tau_{FORM})}\right);$$

in which:
a is the distance of a user-selected dark Kikuchi line from the center of the observed image;
positive sign of calculated φ means clockwise rotation and vice-versa;
$\tau_{FORM}$ is a user-selected angle between the central axis of scanning and a normal to a scanned surface of the sample in radians;
p is the distance from the scanning pivot point of the microscope to a point which corresponds to the center of the observed image on a scanned surface of the sample.

9. Method according to claim 8, wherein the stage movements used for making the selected dark Kikuchi line to pass through the center of the observed image, include rotating the sample stage with the sample by rotation angle yo about the rotation axis for the user-selected angle $\tau_{FORM}$, and tilting the sample about the first tilt axis to a position in which the central axis of scanning and a normal to a surface of the sample enclose the angle $\tau_{FORM}$.

10. Method according to claim 9, wherein the steps are repeated n-times for different user-selected angles $\tau_{FORMi}$ with i being a member of an integer sequence from 1 to n and n being equal to the number of tilt-repetitions of step a), while in the i-th repetition of step a) the sample stage with the sample is tilted by an angle τ about the first tilt axis, the angle τ being such that after this tilt in the step a), the value of the angle between the central axis of scanning and a normal to the scanned surface of the sample (4) equals $\tau_{FORM,i}$ wherein $\tau_{FORM,i}$ is the tilt angle used in the i-th repetition, and wherein the stage movements used in i-th repetition of the step a) for making the selected dark Kikuchi line to pass through the center of the observed image or for putting the dark Kikuchi line to a preliminary position from which it can be made to pass through the center of the image by tilting about the first axis; include rotating by rotation angle about the rotation axis, with rotation angle φ for $\tau_{FORM} = \tau_{FORM,i}$.

11. Method according to claim 2, wherein at least one additional tilt axis is provided such that among these additional tilt axes, there is an axis denoted as a second tilt axis that is substantially perpendicular the first tilt axis, and both mutually substantially perpendicular tilt axes are also substantially perpendicular to one of the rotation axes, and wherein the stage movements for making the selected Kikuchi line to pass through the center of the one or both of the third Electron Channeling Pattern and the third Electron Back-Scattered Pattern include rotating about the rotation axis which is substantially perpendicular to both tilt axes, wherein the rotation angle about the rotation axis is such that the selected Kikuchi line projected on the sample is made perpendicular to the first tilt axis by this rotation, and/or tilting about the second tilt axis by an angle that moves the selected Kikuchi line to the center of the one or both of the third Electron Channeling Pattern and the third Electron Back-Scattered Pattern.

12. Method according to claim 1, wherein two Electron Channeling Contrast Images are acquired for two different sample stage tilt angles about the first tilt axis, the method further including stereoscopic viewing of these two images.

13. Method according to claim 1, further comprising:
  setting a number n of repetitions of the sequence of steps by a user, the number n being higher than one;
  repeating the sequence of steps n-times;
  for each repetition i of step b, calculating the total tilt angle τTOT,i about the first tilt axis, wherein the total tilt angle τTOT,i is a sum of all the tilts about the first tilt axis performed before the i-repetition of step I, and noting ECCIi the Electron Channeling Contrast Image obtained in the i-repetition of step I, whereby i is a member of an integer sequence from 1 to n;
  compiling a measurement set of {(τTOT,i, ECCIi)} and using this set for 3D reconstruction of crystal lattice defects by mathematical methods.

14. A method comprising:
  orienting, based on one or both of an Electron Channeling Pattern and an Electron Back-Scattered Pattern acquired by a detector in a charged particle microscope, a sample in the charged particle microscope so that a crystal lattice plane of the sample is at a Bragg condition with respect to an electron beam directed at a surface of the sample;
  obtaining a first electron channeling contrast image of a region of interest of the sample, the region of interest including a defect;
  tilting the sample while maintaining the Bragg condition; and
  obtaining a second electron channeling contrast image of the region of interest of the sample, the second electron channeling contrast image obtained at the tilted orientation.

15. The method of claim 14, further comprising:
  obtaining additional electron channeling contrast images of the region of interest, each additional electron channeling contrast image obtained at a different tilt angle; and
  generating a three-dimensional reconstruction of the defect based on a combination of all electron channeling contrast images.

16. The method of claim 14, wherein orienting a sample in a charged particle microscope so that a crystal lattice plane of the sample is at a Bragg condition with respect to an electron beam directed at a surface of the sample includes:
  acquiring the one or both of the Electron Channeling pattern and the Electron Back-Scattered Pattern; and determining whether the Bragg condition is obtained based on observed Kikuchi lines.

17. The method of claim 14, further comprising:
stereoscopically viewing the defect based on the first and second electron channeling contrast images of the region of interest.

18. A scanning electron imaging system comprising:
an electron column providing a beam of electrons along an electron column axis;
a detector to detect back scattered electrons; and
a stage to hold a sample so that the electron beam impinges on the sample,
wherein the scanning electron imaging system is configured to:
based on one or both of an Electron Channeling Pattern and an Electron Back-Scattered Pattern acquired by the detector, orient the sample so that a set of crystallographic planes are in a Bragg condition with the beam of electrons;
obtain a first electron channeling contrast image of a region of interest of the sample, the region of interest including a defect, the image formed from detecting backscattered electrons formed when the beam of electrons interacts with the sample;
tilt the sample while maintaining the Bragg condition; and
obtain a second electron channeling contrast image of the region of interest of the sample, the second electron channeling contrast image obtained at the tilted orientation.

19. The system of claim 18 further configured to:
obtain additional electron channeling contrast images of the region of interest, each additional electron channeling contrast image obtained at a different tilt angle; and
generate a three-dimensional reconstruction of the defect based on a combination of all electron channeling contrast images.

* * * * *